United States Patent
Krylov et al.

(10) Patent No.: US 9,354,061 B2
(45) Date of Patent: May 31, 2016

(54) COMPLIANT STRUCTURES WITH TIME-VARYING MOMENT OF INERTIA

(75) Inventors: Viacheslav Krylov, Holon (IL); Assaf Ya'Akobovitz, Ra'anana (IL)

(73) Assignee: RAMOT AT TEL AVIV UNIVERSITY LTD., Tel Aviv (IL)

( * ) Notice: Subject to any disclaimer, the term of this patent is extended or adjusted under 35 U.S.C. 154(b) by 320 days.

(21) Appl. No.: 14/008,756

(22) PCT Filed: Apr. 1, 2012

(86) PCT No.: PCT/IL2012/050114
§ 371 (c)(1),
(2), (4) Date: Oct. 30, 2013

(87) PCT Pub. No.: WO2012/131682
PCT Pub. Date: Oct. 4, 2012

(65) Prior Publication Data
US 2014/0208848 A1    Jul. 31, 2014

Related U.S. Application Data

(60) Provisional application No. 61/470,009, filed on Mar. 31, 2011.

(51) Int. Cl.
*G01C 19/5705* (2012.01)
*G01C 19/06* (2006.01)
*B81B 3/00* (2006.01)

(52) U.S. Cl.
CPC .......... *G01C 19/5705* (2013.01); *B81B 3/0048* (2013.01); *G01C 19/06* (2013.01)

(58) Field of Classification Search
CPC .... G01C 19/56; G01C 19/5712; G01C 19/06; G01C 19/5705; G01C 19/5719; G01C 19/574; B81B 3/00; B81B 3/0048

USPC ............... 73/504.12, 504.14, 504.02, 504.04
See application file for complete search history.

(56) References Cited

U.S. PATENT DOCUMENTS 6,244,111 B1 *  6/2001  Funk ..................... G01C 9/00
                                        73/504.13
6,349,597 B1 *  2/2002  Folkmer ............ G01C 19/5712
                                        73/504.02

(Continued)

FOREIGN PATENT DOCUMENTS

DE     102009001248 A1    9/2010
EP          1416250 A2    5/2004
EP          1832841 A1    9/2007

OTHER PUBLICATIONS

N. Yazdi et al., "Micromachined inertial sensors" Proceedings of The IEEE 86(8):1640-1659 (1998).

(Continued)

*Primary Examiner* — Helen Kwok
(74) *Attorney, Agent, or Firm* — Browdy and Neimark, PLLC

(57) ABSTRACT

A rotation sensor system is presented. The system includes a rotating frame configured to be mounted on a gimbal and configured to be driven for controlled rocking motion about a predetermined axis of the frame, and a proof mass assembly mounted on the rotating frame. The proof mass assembly includes one or more proof mass elements, each mounted to be driven into controlled movement with respect to the predetermined axis along a certain path, such that a distance of each proof mass element from the axis corresponding to a direction of the rocking motion of the frame, thereby affecting a moment of inertia of the rotating frame.

18 Claims, 15 Drawing Sheets

(56) References Cited

U.S. PATENT DOCUMENTS

| | | | | |
|---|---|---|---|---|
| 7,100,446 | B1* | 9/2006 | Acar | G01C 19/5719 73/504.12 |
| 8,042,394 | B2* | 10/2011 | Coronato | G01C 19/5712 73/504.04 |
| 8,347,717 | B2* | 1/2013 | Seeger | G01C 19/5719 73/504.12 |
| 8,429,970 | B2* | 4/2013 | Rocchi | G01C 19/574 73/504.08 |
| 2002/0189351 | A1* | 12/2002 | Reeds | G01C 19/5712 73/504.04 |
| 2004/0083812 | A1* | 5/2004 | Ichinose | G01C 19/5719 73/504.02 |
| 2005/0082520 | A1 | 4/2005 | Fathimulla et al. | |
| 2007/0214883 | A1* | 9/2007 | Durante | G01C 19/5712 73/504.04 |
| 2011/0303007 | A1* | 12/2011 | Rocchi | G01C 19/574 73/504.09 |

OTHER PUBLICATIONS

K. Liu, et al. "The development of micro-gyroscope technology" J. Micromech. Microeng. 19 (2009) pap. 113001—Abstract only.

M. Tanaka., "An industrial and applied review of new MEMS devices features" Microelectronic Eng. 84(5-8):1341-1344 (2007)—Abstract only.

C. Shearwood., et al., "Development of a levitated micromotor for application as a gyroscope" Sensors and Actuators A 83:85-92 (2000)—Abstract only.

A. K. Geim et al. "Detection of earth rotation with a diamagnetically levitating gyroscope" Physica B 294-295, 736-739 (2001)—Abstract only.

M. Kraft, et al. "Modelling and design of an electrostatically levitated disc for inertial sensing applications" J. Micromech. Microeng. 11:423-427 (2001).

Y. Hong, et al., "Modeling of angular-rate bandwidth for a vibrating microgyroscope" Microsystem Technologies 9 (441-448 (2003)—Abstract only.

C. Feng, et al., "Dynamic characteristics of vibratory gyroscopes" IEEE Sensors Journal 4(1):80-84 (2004) Abstract only.

M. Saukoski, et al., "Zero-rate output and quadrature compensation in vibratory mems gyroscopes" IEEE Sensors Journal 7(12):1639-1652 (2007)—Abstract only.

S. E. Alper, et al., "Symmetrical and decoupled nickel microgyroscope on insulating substrate"Sensors and Actuators A 115:336-350 (2004).

S. E., et al. "A low-cost rate-grade nickel microgyroscope. Sensors and Actuators" A 132:171-181 (2006).

N.C. Tsai., et al. "Design and dynamics of an innovative micro gyroscope against coupling effects" Microsyst. Technol. 14:295-306 (2008)—Abstract only.

C. Acar, et al., "Structurally decoupled micromachined gyroscopes with post-release capacitance enhancement". J. Micromech. Microeng. 15:1092-1101 (2005).

S. Krylov, et al., "Stabilisation of electrostatically actuated microstructures using parametric excitation" J. Micromech. Microeng. 15 (2005) 1188-1204—Abstract only.

S. Krylov, et al., "Excitation of large amplitude parametric resonance by the mechanical stiffness modulation of a microstructure" J. Micromech. Microeng. 20: pap. 015041 (2010)—Abstract only.

J. F. Rhoads, et al., "The nonlinear response of resonant microbeam systems with purely-parametric electrostatic actuation" J. Micromech. Microeng. 16:890-899 (2006).

J. F. Rhoads, et al., S. W. Shaw, K. L. Turner. Nonlinear dynamics and its applications in micro- and nanoresonators. Purdue University, Purdue e-Pubs Oct. 1, 2008.

F. Braghin, et al., "Nonlinear dynamics of vibrating MEMS" Sensors and Actuators A 134, 98-108 (2007)—Abstract only.

R. R. A. Syms., "Electrothermal frequency tuning of folded and coupled vibrating micromechanical resonators" J. of Microelectromech. Syst. 7(2) (1998) 164-171.

D. H. Tsai, et al., "Design and simulation of a dual-axis sensing decoupled vibratory wheel syroscope" Sensors and Actuators A 126:33-40 (2006).

S. Rajendran, et al., "Design and simulation of an angular-rate vibrating microgyroscope" Sensors and Actuators A 116 : 241-256 (2004) Abstract only.

D. Schwartz, et al., "Frequency tuning of a disk resonator gyro via mass matrix perturbation" J. Dyn. Syst. Control 131: pap. 061004 (2009)—Abstract only.

C. Acar, et al., "An approach for increasing drive-mode bandwidth of mems vibratory syroscopes" J. of Microelectromech. Syst. 14(3):520-528 (2005).

B. Andò, et al., "Behavior analysis of ferrofluidic gyroscope performances" Sensors and Actuators A 162:348-354 (2010)—Abstract only.

B. Ilic, et al., "Attogram detection using nanoelectromechanical oscillators" J. Appl. Phys. 95:3694-3703 (2004)—Abstract only.

B. Ilic, et al., "Enumeration of DNA molecules bound to a nanomechanical oscillator" Nano Letters 5:925-929 (2005)—Abstract only.

L.F. Shampine, et al., "Solving boundary value problems for ordinary differential equations in MATLAB with bvp4c", Oct. 26, 2000.

I. I. Blekhman, et al., "Vibrational Mechanics: Nonlinear Dynamics Effects, General Approach, Applications, World Scientific" Singapore, 509:1-4 (2000).

S.Krylov, et al., "The pull-in behavior of electrostatically actuated bistable microstructures" J. Micromech. Microeng. 18:055026 (2008)—Abstract only.

T. Remtema, et al., "Active frequency tuning for micro resonators by localized thermal stressing effect" Sensors and Actuators A 91(3):326-332 (2001)—Abstract only.

R. Rand "Lecture Notes on Nonlinear Vibrations"Department Theortical & Applid Mechanics, Cornell University, Version 52 (2005).

L. A. Oropeza-Ramos, et al., "Robust micro-rate sensor actuated by parametric resonance Sensors and Actuators A" 152:80-87 (2009) Abstract only.

S. Krylov, et al., "Large displacement parallel plate electrostatic actuator with saturation type characteristic" Sensors and Actuators A 130-131:497-512 (2006)—Abstract only.

Z. Hu, et al., "An experimental study of high gain parametric amplification in MEMS. Sensors and Actuators A" 162:145-154 (2009)—Abstract only.

International Search Report of PCT/IL2012/050114 mailed Jun. 8, 2012.

* cited by examiner

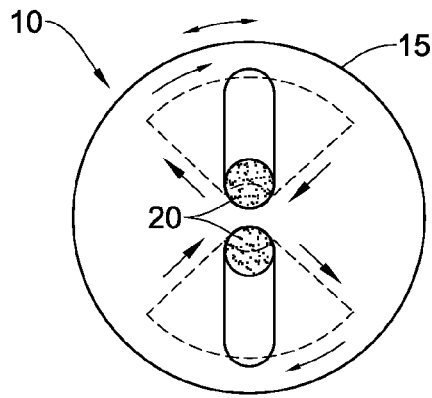 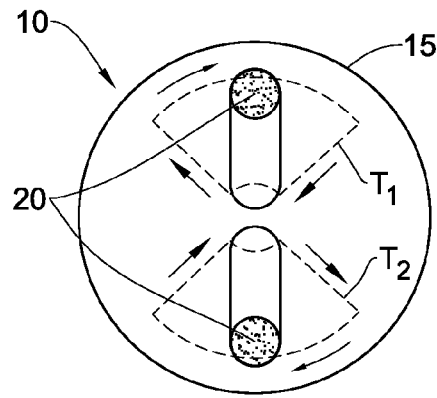
Fig. 1A    Fig. 1B
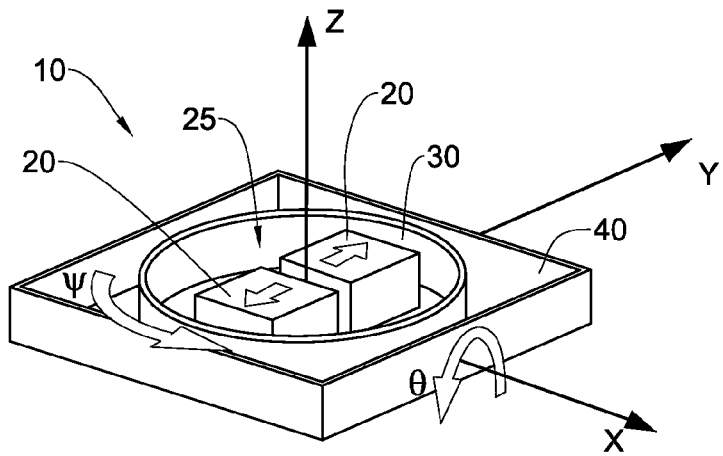
Fig. 2A
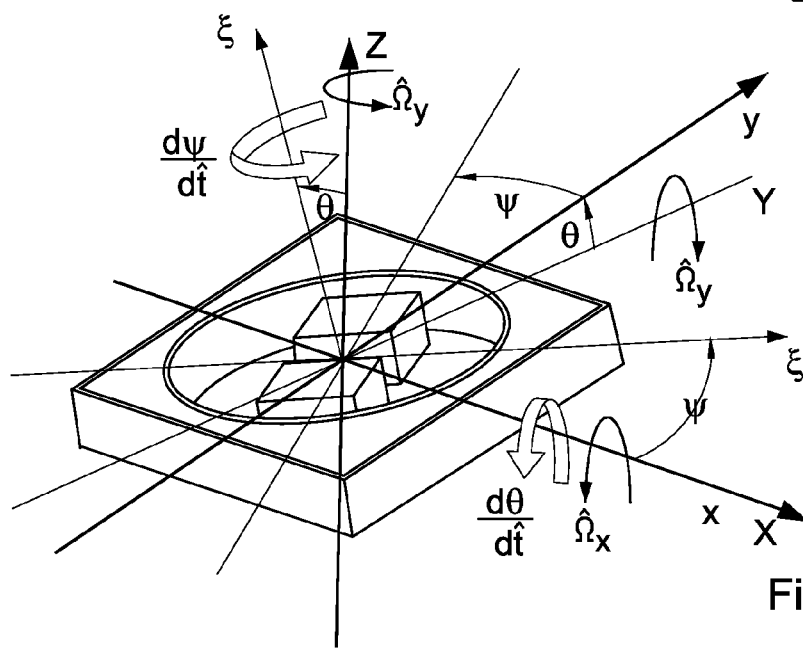
Fig. 2B

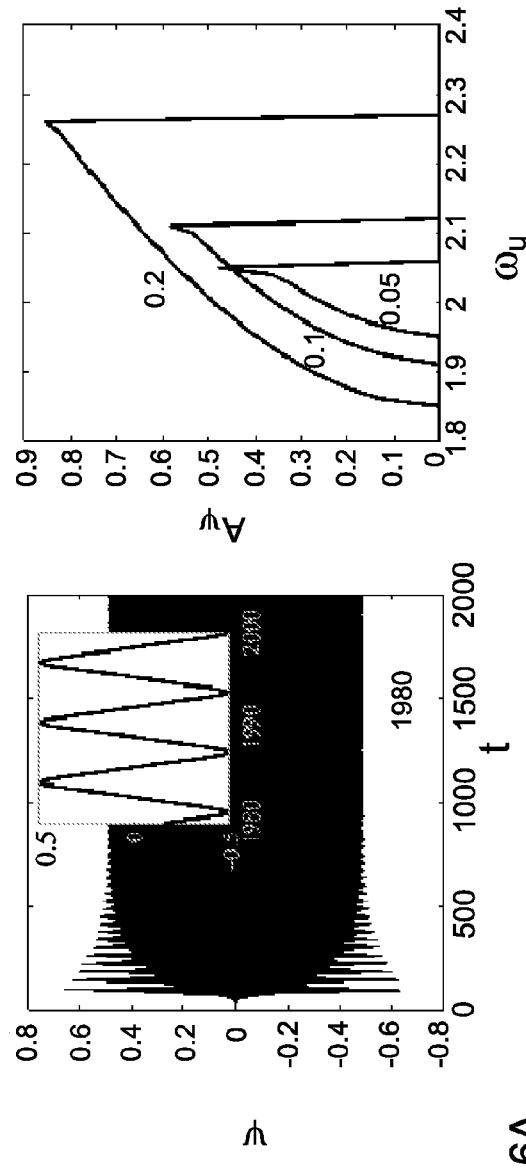
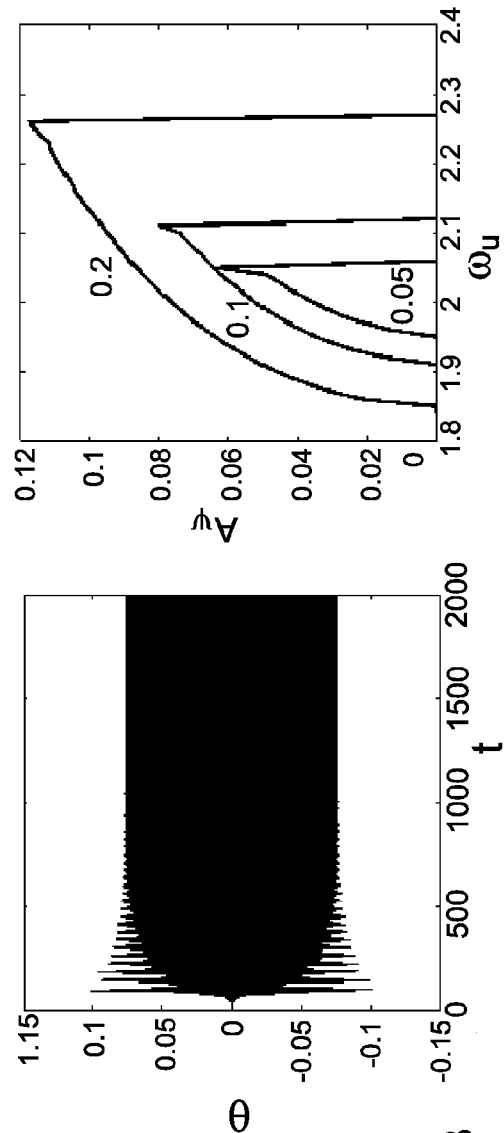
Fig. 6A
Fig. 6B
Fig. 6C
Fig. 6D

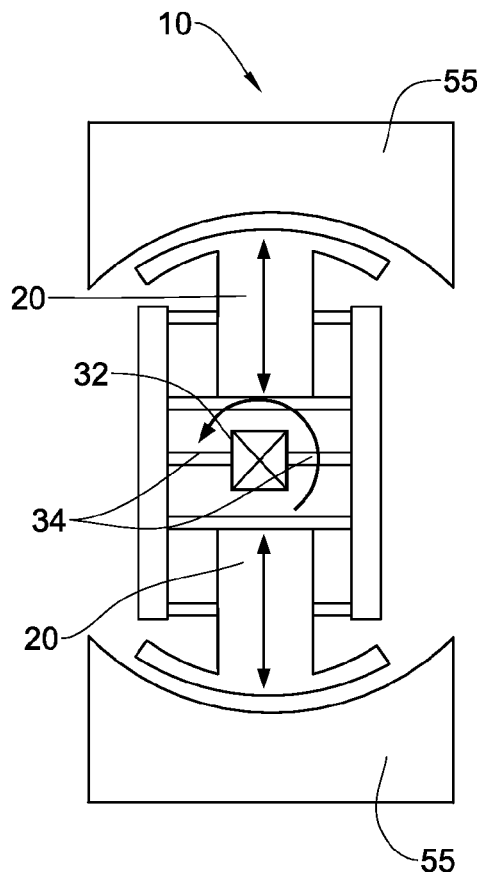 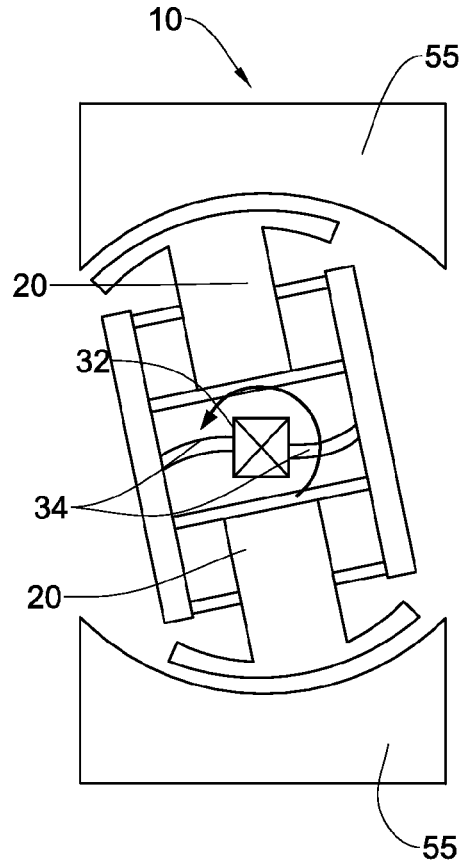
Fig. 11A         Fig. 11B
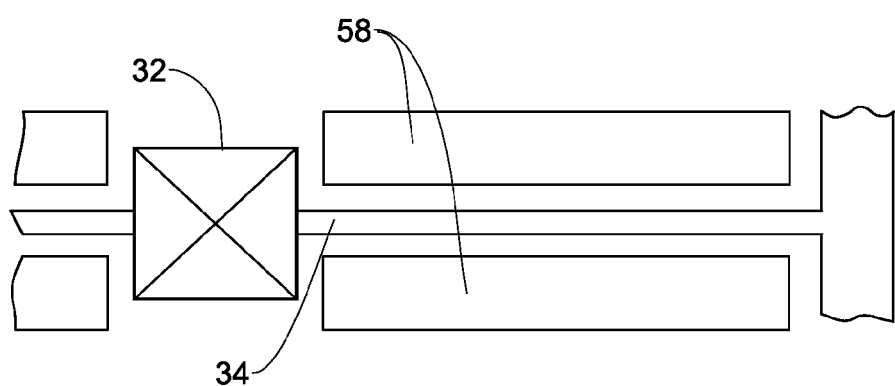
Fig. 11C

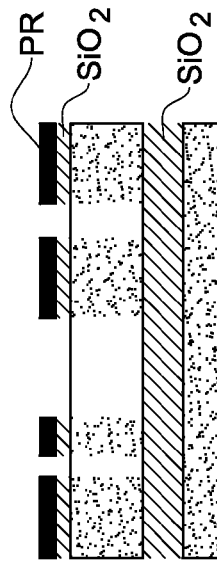
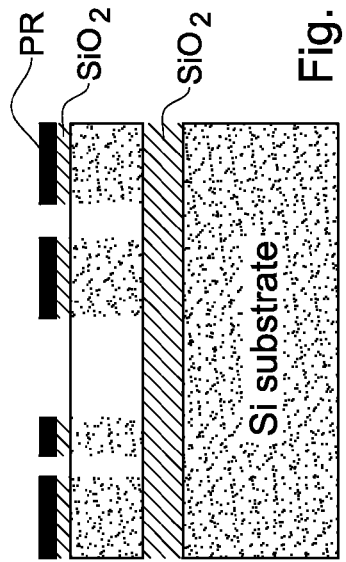
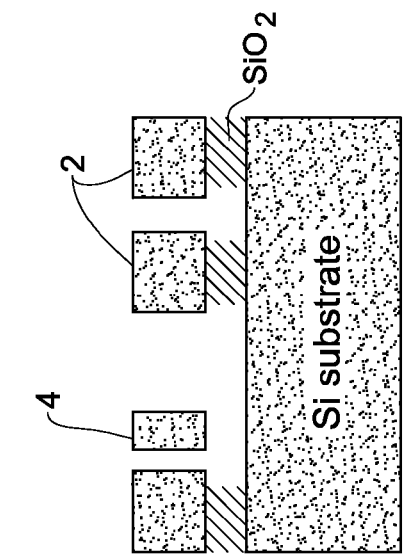
Fig. 16A
Fig. 16B
Fig. 16C
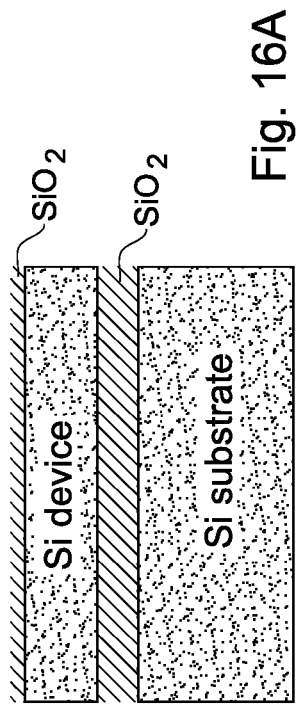
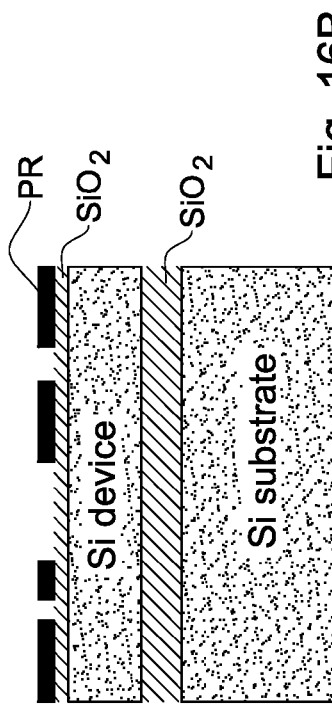
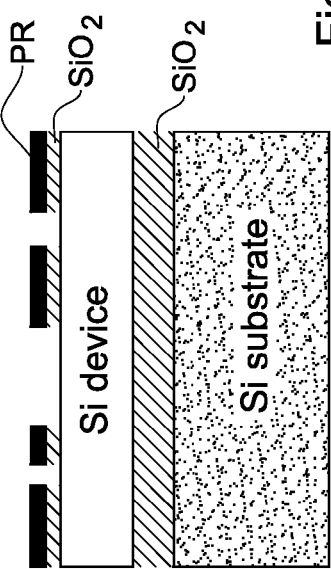
Fig. 16D
Fig. 16E

COMPLIANT STRUCTURES WITH TIME-VARYING MOMENT OF INERTIA

FIELD OF THE INVENTION

This invention relates to micro-electromechanical devices for measurement of angular rate and for actuation.

BACKGROUND OF THE INVENTION

Dynamically operated micro- and nano-electromechanical (MEMS and NEMS) devices may be utilized for applications in various areas of engineering due to their small size, low fabrication cost, low energy consumption, unique performance and suitability for integration into complex functional engineering systems. Inertial micromechanical sensors such as accelerometers and angular rate sensors (i.e. micro gyros) are among the most intensively investigated dynamically operated micro devices, and continue to attract attention of researchers and developers of MEMS-based products. This is due to huge potential of integration of micro gyroscopes in various fields such as the automotive, aerospace, defense, as well as biomedical and consumer electronics.

Historically first and still most accurate mechanical gyroscopes are stabilized platform devices consisting of a gimballed spinning body. The angular rate is detected by measuring the suspension gimbal tilting angle, which is proportional to the product of the angular momentum of the spinning disk and of the angular rate to be measured.

GENERAL DESCRIPTION

An implementation of unidirectional, non-vibratory (e.g., spinning) motion in microstructures is challenging due to low reliability of microfabricated elements/parts configured to perform relative motion. Such continuous relative motion is unavoidably accompanied by contact, friction and possibly stiction or microfabricated elements. In order to overcome these difficulties, most microdevices are realized as compliant structures performing vibratory motion rather than continuous rotation. One impart to such motion is that the momentum averaged over the period of vibration is zero. As a result, the operational principle of most micromachined gyros (gyroscopes) differs from that governing the performance of their macro scale spinning disk based counterparts and relies on the resonant coupling between two degenerate vibratory modes (i.e., modes with equal frequencies). Resonant coupling between these initially uncoupled vibratory modes arises due to the Coriolis force appearing when the platform that device is attached to rotate.

Some micro gyroscope sensors have been designed to incorporate spinning disks being electrostatically or magnetically levitated from a holding structure to eliminate frictions of the elements. However, electrostatically or magnetically levitated bodies are intrinsically unstable and intricate feedback control approaches are necessary in order to stabilize such systems. Moreover, such gyro systems require relatively complex fabrication processes.

Typical micro-gyroscope devices, as known in the art, include one or more vibrating elements having at least two vibration modes. The elements (e.g. one of several proof masses) are forced to vibrate at one of the modes (commonly referred to as a drive mode) while the vibrational amplitude of the second (sense) mode, which is proportional to the Coriolis force affecting the vibrating elements, is measured. Resonant amplification is usually implemented since the Coriolis force appearing in these miniature devices is extremely small. The resonant coupling imposes tough requirements on the matching between the resonant frequencies associated with the two modes. This frequencies matching is challenging due to low tolerances of micromachining. On the other hand, devices in which the two frequencies are very close or equal often suffer from undesired structural coupling, resulting in the excitation of the sense mode even at zero angular rate. This erroneous zero-rate output, often referred to as a quadrature error, is one of the major sources of error in micro scale gyros. It should be noted that these difficulties are much less pronounced in spinning-disk gyros where the tilting mode frequency of a suspension gimbal is much lower (or even zero in an integrating gyro incorporating a freely rotating gimbal) than the spinning angular velocity and angular rate is extracted from the measurement of a steady deflection of the gimbal rather than its vibrations.

In view of the above, there is a need in the art to provide a fully compliant, and therefore reliable and robust micro scale structure for use in angular rate micro sensors (e.g. gyroscopes or gyro-based devices). To this end, the inventor of the present invention have realized that a structure utilizing non-zero angular momentum can provide spinning-disc like characteristics to thereby enable detection and measurement of angular rate. The system of the present invention relies on novel operational principles for such angular rate micro sensors.

Such non-zero angular momentum can be achieved in vibratory structures by providing control on inertial properties of the vibrating elements for example. The inertial properties of the structure can be changed in such a way that its moment of inertia is larger during one part of the period (e.g. when the angular velocity is positive), and lower during one other part of the period (e.g. when the angular velocity is negative). Due to these variations of the moment of inertia, averaging of the angular momentum over the period results in a non-zero value. It should be noted that is the field of microdevices, the stiffness of suspension elements and connectors can be controlled in a relatively straightforward technique by, for example, application of an electrostatic force or electric current. However, inertial properties of a device are determined by mass and mass configuration of the device and thus the tuning of these inertial properties is more challenging.

The present invention provides a novel class of fully compliant structures configured to perform vibratory motion, yet capable to exhibit non-zero averaged momentum. This characteristic of the device is enabled due to controllable variation of inertial parameters of the device through time. The technique of the present invention may be used in micro-electromechanical systems (MEMS) and applications, where an implementation of unidirectional, non-vibratory motion involving relative motion of parts is not desirable for reliability reasons. However, the same approach can be used also in macro scale compliant devices to improve reliability. The technique of the present invention is focused on varying the moment of inertia of rotating/rocking elements (proof mass assembly) and preferably does not change the mass or quantity of the rotating elements. The moment of inertia of the proof mass assembly which performs tilting/rocking vibrations may be controlled in such a way that it is higher or lower, depending on the sign of the angular velocity. This results in an average non-zero angular momentum over a complete cycle. Simple approximate expressions for the averaged momentum and steady tilting angle can be obtained analytically and validated numerically. Based on the model results for different operational scenarios, the kind of structures of the present invention can be efficiently used in fully compliant actuators and vibratory angular rate sensors (micro gyros) with a steady response in a sensing mode ("pseudo spinning disk gyros"), as well as in a parametrically excited gyro. In addition, the ability to achieve a non-zero momentum allows very efficient actuation of the devices using, for example, parametric excitation. It should be noted that the technique of the present invention may advantageously be used in stabilizing devices and in North finding devices ("gyro compass").

To this end, the angular rate sensor system according to the present invention comprises a rocking frame, which may define boundaries of the frame or a certain surface or volume, configured to perform vibrations about certain predetermined axis with a certain period. A proof mass assembly is mounted on the rocking frame and is configured to enable variations of its moment of inertia. The proof mass assembly comprises one or more proof mass elements, each mounted onto the rocking frame for controllable movement relative to the predetermined axis. Variations of a distance between each of the proof mass elements from said axis actually change the moment of inertia of the proof mass assembly. According to some operational schemes of the system, the movement of the proof mass elements and the distance thereof from the axis of rotation of the rocking frame is configured to be in substantially the same periods as the rocking motion such that the distance of the proof mass elements from the axis correspond to a direction of the rocking motion of the frame. Accordingly, during the part of the period when the rocking frame rotation is clockwise the proof mass assembly may have larger moment of inertia relative to the part of the period when the rocking frame rotates counterclockwise. This operational scheme provides a rotating structure having non-zero angular momentum and thus can operate is a substantially similar fashion as conventional macroscopic spinning disc gyroscopes.

Thus, the present invention provides a system comprising an external frame, a rotating frame and one or more proof masses connected by springs to said rotating frame, location of said proof masses along a radial axis of said rotating frame being adjustable to thereby provide variations to a moment of inertia of said rotating frame.

According to one broad aspect of the present invention there is provided a rotation sensor system comprising a rotating frame configured to be mounted on a gimbal and adapted for controllable rocking motion about a predetermined axis of said frame, and a proof mass assembly mounted on said rotating frame. The proof mass assembly comprises one or more proof mass element each mounted for controllable movement with respect to said predetermined axis along a certain path. A distance of the proof mass elements from said axis corresponds to a direction of the rocking motion of said frame, thereby affecting a moment of inertia of said rotating frame.

Each of said one or more proof mass elements may be elastically connected to said rotating frame. The elastic connection may be provided by a springing assembly configured to provide said elastic connection of the one or more proof mass elements to the rotating frame.

According to some embodiments the rotation sensor system comprises an electrode assembly controllably operable to create and maintain a predetermined electric field within a field region, said proof mass assembly being located in the field region, thereby providing said controllable movement of the one or more proof mass elements.

The proof mass assembly may comprise two or more of said proof mass elements arranged in a symmetric fashion around said predetermined axis of rotation defined by said rotating frame. The proof mass elements may be arranged in a circular array around said predetermined axis.

According to some embodiments of the present invention, the rotation sensor system is configured as a planar system extending within a plane intersecting with said predetermined axis. According to some other embodiments the rotation sensor system is configured as a planar system extending within a plane parallel to said predetermined axis.

The rotating frame of the system of the present invention may carry a light deflection assembly, such that different angular positions of the frame during the rocking motion thereof correspond to different deflection directions of light incident on said deflection assembly.

The rotation sensor system of the invention may be configured such that frequency of rotation of said rocking frame and frequency of movement of said proof mass assembly correspond to thereby provide the system with non zero angular momentum.

According to some embodiments the rotation sensor system may comprise an electrode arrangement providing an electric field configured to vary stiffness of connectors connecting said one or more proof mass elements to said rocking frame.

The rotation sensor system of the present invention may comprise a control unit configured and operable to provide drive force to thereby force at least one of said one or more proof mass elements of the proof mass assembly and rotation of said rocking frame with a predetermined frequency.

The control unit may be configured and operable to force movement of said one or more proof mass elements at a frequency being equal to twice the rotation frequency of said rocking frame, thereby actuating rotation of said rocking frame. Alternatively or additionally the control unit may be configured and operable to control a relative phase between rotation of said rocking frame and movement of said one or more proof mass elements.

The control unit may be configured to force rotation of the rocking frame and movement of said one or more proof mass elements with a predetermined frequency and phase to thereby provide the system of a certain non zero angular momentum. The control unit may operate to control said relative phase to thereby vary moment of inertia of said rocking frame at a frequency corresponding to a natural frequency of a gimbal holding said rocking frame, thereby enabling coupling of said variation of the moment of inertia with tilting of said gimbal in accordance with external angular rotation. The control unit may also operate to control said relative phase to vary moment of inertia of said rocking frame to thereby enable tuning of rotation frequency of said frame.

According to some embodiments of the present invention the rotation sensor system is configured as a micro rotation sensor system.

According to one other broad aspect of the present invention there is provided a structure comprising a rotatable frame and one or more movable proof mass elements elastically connected to said frame. The structure is configured to enable displacement of said one or more proof mass elements along a predetermined path thereby varying a mass distribution of the structure with respect to an axis of rotation of said frame. The structure may comprise one or more electrode arrangements generating electric field configured to control at least one of rotation of said frame and displacement of said one or more proof mass elements with certain frequency.

The structure may be configured such that a resonance frequency of displacement of said proof mass elements and a resonance frequency of rotation of said rotatable frame being selected to enable parametric amplification of said rotation of the rotatable frame by periodic displacement of said one or more proof mass elements.

BRIEF DESCRIPTION OF THE DRAWINGS

In order to understand the invention and to see how it may be carried out in practice, embodiments will now be described, by way of non-limiting example only, with reference to the accompanying drawings, in which:

FIGS. 1A and 1B schematically illustrate the operation principles of the present invention, showing a structure of the invention during two stages of rotation;

FIGS. 2A and 2B illustrate an example of the structure according to the invention and the system of coordinates in an initial configuration (FIG. 2A) and in the deformed configuration (FIG. 2B) and its principles of operation;

FIGS. 6A-6E show results of numerical simulations illustrating a use of the system of the present invention as vibratory gyro and for parametric excitation of rotation of said system, FIGS. 6A-6B show temporal profile of the drive and sense modes respectively and FIGS. 6C-6E show response profile of the rocking motion (FIGS. 6C-6D) and the sense mode (FIG. 6E) with respect to drive mode frequency and amplitude;

FIGS. 11A-11C illustrate a configuration of the angular rate sensor configured as a micro sensor device, FIG. 11A shows the device in relaxed form, FIG. 11B show the device in deformed form and clarifies the configuration of the electrode providing an electrostatic force directed along the radial trajectory of the masses and unaffected by the rotation of the frame and FIG. 11C illustrates an approach allowing tuning of the stiffness of the device elastic suspension;

FIGS. 16A-16E illustrate manufacturing technique which may be used to produce a micro sensor according to the present invention.

DETAILED DESCRIPTION OF EMBODIMENTS

Figure 3A:
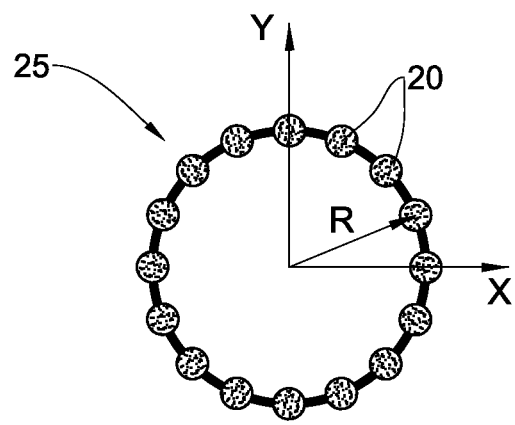
FIGS. 3A and 3B further illustrate principles of operation according to some other embodiments of the invention.

As detailed above, the technique of the present invention utilizes control on inertial properties of rotatable elements (proof mass) within the rotation sensor system. The moment of inertia of the structure can be changed with or without varying the mass of elements in the system. However it should be noted that the variation of the moment of inertia of a structure may typically be done by varying the mass distribution within the structure.

Reference is made to FIGS. 1A-1B, illustrating an example of an angular rate sensor system 10 with a variable moment of inertia. The system is configured to operate with non-zero averaged angular momentum and thus provide a pseudo spinning disk effect. In particular, FIGS. 1A-1B show an example of a system 10 configured to enable a time-varying moment of inertia, in this specific and non-limiting example the system 10 is based on a rocking disk 15 and a proof mass assembly with two (generally at least two) radially movable masses 20. FIG. 1A illustrates a configuration of the system 10 and the proof mass assembly during counterclockwise motion of the rocking disk, while FIG. 1B illustrates a configuration of the system and the proof mass elements 20 of the proof mass assembly during clockwise motion. The dashed lines T1 and T2 show the trajectory of the proof mass elements 20 and the arrows illustrate the direction of the mass motion along this trajectory. The masses 20 are typically connected to the frame or axis of the disk by flexible, spring-like, elastic suspensions which are not specifically shown in these figures.

The sensor system incorporates a proof mass assembly including two masses 20 (generally, at least two proof masses) and configured for performing a vibratory rocking motion about its center. The two or more proof mass elements are arranged as to perform the vibratory motion with the structure while being constrained to move along the radius of the disk 15. The masses 20 are attached to the disk 15 by springs or using other type of attachment which enable controllable movement of the masses. Each of the movable masses 20 is generally configured to move within a region between two locations, one location is closer to the rotation axis of the structure while the other location is further towards the periphery of the structure. By moving the masses between two positions, the one closer to the rotation axis and the one which is further apart from the center of rotation, it is possible to vary the moment of inertia of the rotating structure (frame). These variations of the moment of inertia can consequently vary the magnitude of the corresponding angular momentum during that part of the period in which the masses 20 are located in a certain position. To this end, the system 10 can be configured such that the masses are located closer to the center of rotation during clockwise part of the rotation movement, and in the periphery thereof during the counterclockwise part of the rotation. This configuration provides that during one part (clockwise) of the rotation the moment of inertia of the structure is smaller than during the second part (counterclockwise) of the rotation, which results variation of the angular momentum during the two parts of the rotation. Thus, the angular momentum of the structure averages during a complete rotation cycle to a non-zero value.

It should be noted that while the moment of inertia is changed, the total mass of the disk and of the masses may remain time-independent (i.e. unchanged). It should also be noted that despite the vibratory character of motion of the disk and of the masses, each of the proof mass elements 20 actually can be viewed to perform a unidirectional, closed trajectory, rotation in a clockwise direction, resulting in a non-zero averaged angular momentum. It should be understood that the masses are switched between two positions by application of an external force. In the absence of the force, due to the centrifugal force, the mass would be located at the outer position during the entire period and the moment of inertia of the system would be constant. The presence of average non-zero angular momentum enables exploitation of the structure, when placed in a non-inertial rotating reference frame, for extraction of angular rate. This structure can therefore be used in a similar technique to the conventional spinning disk gyros. However, in contrast to the spinning disk gyro, the structure of the present invention is fully compliant, incorporates components performing only vibratory motion and can be realized by using common micro-fabrication technologies.

It should be noted that the forced (drive mode) rocking motion of the proof mass with time-independent moment of inertia is commonly implemented in rotating wheel vibratory micro gyroscopes distinguished by lower sensitivity to linear accelerations and less pronounced structural coupling. In these devices, the sensing mode is associated with a linear or tilting motion, while the natural frequencies of both modes are matched. In contrast to several techniques utilizing resonant Coriolis coupling between two modes with equal or close resonant frequencies, the structure of the present invention may be based on operational principles utilizing time-dependent moment of inertia resulting in the non-zero averaged angular momentum. The presence of non-zero angular momentum allows non-vibratory character of the measurement of the sensing mode response to be possible. This, in contrast to the known devices utilizing vibratory motion, eliminates the necessity in the frequencies matching between modes and allows accumulation of the output signal (of the static titling angle of the sense mode) therefore improving the performance of the sensor.

In order to provide an insight into the rich dynamics of the structures of the present invention, to analyze their behavior and investigate the feasibility of the proposed angular rate sensing approach, the inventors have constructed a relatively simple, yet quite general lumped model of the structure. The derivation of the equations of motion is followed by the analysis of several simplified particular configurations or operational scenarios. The results of a numerical exploration are then presented for more general cases and used for the verification of simplified expressions.

Reference is made to FIGS. 2A-2B illustrating an example of a structure architecture for use in rotation sensor 10 according to embodiments of the present invention and the principle of operation of such rotation sensor device 10. More specifically, FIG. 2A shows geometry of the device 10 in an undeformed configuration, while FIG. 2B shows the geometry and corresponding coordinate systems in a deformed configuration. The device 10 shown schematically in FIGS. 2A-2B can generally be viewed as a three-degrees-of-freedom (DOF) system and contains an external frame 40 (hereafter referred to as a gimbal) which is configured to be anchored onto a platform (e.g. a vehicle), an internal frame 30 mounted on the gimbal and several identical proof masses 20 attached to the frame.

In this example, the set of X, Y, Z define the coordinate frame attached to the vehicle, x, y, z define the coordinate frame attached to the gimbal 40 and $\xi$, $\eta$, $\zeta$ define the coordinate system attached to the internal frame 30. The gimbal 40 is constrained to perform tilting motion about the X axis by an angle $\theta$ and is attached to the vehicle by two light (substantially massless) elastic torsion axes with total torsion stiffness $\hat{k}_\theta$ (note specifically shown). It should be noted that the hat (circumflex) ( ˆ ) as used herein denotes dimensional quantities. In addition to the stiffness, the torsion axes have a damping element (linear viscous or "dashpot") which provides a tilting moment $\hat{c}_\theta \cdot d\theta/d\hat{t}$. The internal frame 30 is attached to the gimbal 40 by elastic member (e.g. a spring, not specifically shown), configured to be light or substantially massless. The total stiffness of the connecting member is $\hat{k}_\psi$, and the damping coefficient of the connecting member is $\hat{c}_\psi$. The connector is configured to allow the internal frame 30 to perform tilting motion about the z axis, which is perpendicular to the plane xy of the gimbal 40. To distinguish the motion of the internal frame 30 from that of the gimbal 40, the internal frame motion is referred hereafter as rotation or rocking motion. The corresponding rotation angle of the rocking frame (the angle between the axes $\chi$ and $\xi$ and between y and $\eta$) is denoted by $\psi$. Each of the proof masses 20 is constrained to move only in the radial direction relative to the internal frame. The masses 20 are configured to move in synchronization with the rotation of the frame 30 and at any time the masses 20 are displaced in the direction outward from the center of the frame by $\hat{u}(\hat{t})$. It should be noted that the number of the proof masses 20 can be two or larger, while the total mass of the proof masses 20 is denoted herein as M. The masses 20 are arranged such that a distance between the center of each of the masses and the origin of the coordinate system (the center of frame 30) is equal between the masses, and is denoted herein as R. According to the example, each of the masses 20 is attached to the frame by massless spring of stiffness $\hat{k}_u/n$ (i.e., $k_u$ is actually the total stiffness of all the springs) and by a dashpot with a damping coefficient $\hat{c}_u/n$. It should however be noted that the proof masses may be attached by other attaching member having certain predetermined stiffness and certain dumping coefficient, e.g. flexible beams. The masses 20 may also be connected between themselves by additional connecting members having the same or different stiffness and dumping coefficients. This connection between the proof masses 20 may be utilized to provide the synchronous motion thereof. In this case and under the assumption of the symmetric motion, the stiffness $\hat{k}_u$ is viewed as a total stiffness of the springs, i.e. the effective stiffness affecting the masses' 20 motion.

Assuming a vehicle on which the rotation sensor of the present invention is mounted performs rotational motion around a certain point (described as the origin of a corresponding coordinate system) with a prescribed time-independent angular velocity $\hat{\Omega}$ with the components $\hat{\Omega}_X$, $\hat{\Omega}_Y$, $\hat{\Omega}_Z$, which are to be measured. The components of the angular velocity vector $\hat{\omega}_G$ of the gimbal 40 of the rotation sensor 10 are:

$$\hat{\omega}_x = \hat{\Omega}_X + \frac{d\theta}{d\hat{t}} \qquad (1)$$
$$\hat{\omega}_y = \hat{\Omega}_Y \cos(\theta) + \hat{\Omega}_Z \sin(\theta)$$
$$\hat{\omega}_z = \hat{\Omega}_Y \sin(\theta) + \hat{\Omega}_Z \cos(\theta)$$

This is while the angular velocity components $\hat{\omega}_F$ of the frame 30 and of the masses 20 can be written as:

$$\hat{\omega}_\xi = \hat{\omega}_x \cos(\psi) + \hat{\omega}_y \sin(\psi)$$ (2)

$$\hat{\omega}_\eta = \hat{\omega}_x \sin(\psi) + \hat{\omega}_y \cos(\psi)$$

$$\hat{\omega}_\zeta = \hat{\omega}_z + \frac{d\psi}{d\hat{t}}$$

where both θ and ψ are time dependent (i.e. $\theta=\theta(\hat{t})$, $\psi=\psi(\hat{t})$).

The kinetic energy of the system has the form (each of the proof mass elements 20 has mass of M/n)

$$\hat{T} = \frac{1}{2}\hat{\omega}_G^T \hat{I}^G \hat{\omega}_G + \frac{1}{2}\hat{\omega}_F^T(\hat{I}^F + \hat{I}^M)\hat{\omega}_F + \frac{1}{2}M\left(\frac{d\hat{u}}{d\hat{t}}\right)^2$$ (3)

Here $\{\ \}^T$ denotes the matrix transpose and $\hat{I}^G = I\{\hat{I}_x^G, \hat{I}_y^G, \hat{I}_z^G\}^T$, $\hat{I}^F = I\{\hat{I}_\xi^F, \hat{I}_\eta^F, \hat{I}_\zeta^F\}^T$, $\hat{I}^M = I\{\hat{I}_\xi^M, \hat{I}_\eta^M, \hat{I}_\zeta^M\}^T$ (where I denotes the unit matrix) are tensors of the moments of inertia of the gimbal 40, the frame 30 and the total moment of inertia of the proof masses 20, respectively. It should be noted that although the level of perturbation of the moments of inertia can be prescribed by an appropriate choice of the ratio between û (the deflection of the proof masses 20) and R (the maximal deflection of the proof masses), and that the frame can thus be excluded from the consideration, the term $\hat{I}^F$ is kept in the formulation for the sake of generality and in order to have more flexibility in analysis.

The potential energy (equation 4) associated with the deformation of the springs connecting the masses 20 to the frame 30, the frame 30 to the gimbal 40 and the gimbal 40 to the corresponding platform together with the Rayleigh's dissipation function (eqn. 5) are given by:

$$\hat{U} = \frac{1}{2}\hat{k}_\theta\theta^2 + \frac{1}{2}\hat{k}_\psi\psi^2 + \frac{1}{2}\hat{k}_u\hat{u}^2 - \hat{M}_\psi\psi - \hat{F}_u\hat{u}$$ (4)

$$\hat{F} = \frac{1}{2}\hat{c}_\theta\left(\frac{d\theta}{d\hat{t}}\right)^2 + \frac{1}{2}\hat{c}_\psi\left(\frac{d\psi}{d\hat{t}}\right)^2 + \frac{1}{2}\hat{c}_u\left(\frac{d\hat{u}}{d\hat{t}}\right)^2$$ (5)

The two last terms of the potential energy (equation 4) are associated, respectively, with the applied (actuating) moment $\hat{M}_\psi$ forcing the frame 30 and the masses 20 to rotate about the ζ-axis and the actuating force $\hat{F}_u/n$ applied to each of the masses 20 in the radial direction relative to the frame. In order to simplify the development and analyze the dynamics of the system non-dimensional quantities were used, Table 1 shows the characteristics quantities and corresponding non-dimensional parameters:

TABLE 1

| t | $\hat{t}/t_0$ | Time |
|---|---|---|
| u | $\hat{u}/r$ | Deflection |
| $F_u$ | $r\hat{F}_u/k_\psi^0$ | Actuation force |
| $M_\psi$ | $\hat{M}_\psi/k_\psi^0$ | Actuation moment |
| $k_\theta$ | $\hat{k}_\theta/k_\psi^0$ | Gimbal stiffness |
| $k_\psi$ | $\hat{k}_\psi/k_\psi^0$ | Frame stiffness |
| $k_u$ | $\hat{k}_u r^2/k_\psi^0$ | Mass stiffness |
| $c_\theta$ | $\hat{c}_\theta/\sqrt{k_\psi^0 I_0}$ | Gimbal damping coefficient |
| $c_\psi$ | $\hat{c}_\psi/\sqrt{k_\psi^0 I_0}$ | Frame damping coefficient |
| $c_u$ | $\hat{c}_u r^2/\sqrt{k_\psi^0 I_0}$ | Mass damping coefficient |
| T | $T/I_0\omega_0^2$ | Kinetic energy |
| U | $\hat{U}/k_\psi^0$ | Potential energy |
| $F_u$ | $\hat{F}_u/k_\psi^0\omega_0$ | Dissipation function |

For convenience, the units of time and length are described as follows:

$$t_0 = \sqrt{\frac{I_0}{k_\psi^0}} \quad r = \sqrt{\frac{I_0}{M}}$$ (6)

where $$I_0 = \hat{I}_\zeta^F + \hat{I}_\zeta^M$$ (7)

is the moment of inertia of the frame and of the masses about the ζ-axis in the undeformed configuration/rest orientation and $k_\psi^0$ is the initial value of the stiffness of the beads associated with the rocking of the frame. The expressions for the kinetic and the potential energy, as well as for the Rayleigh dissipation function in the non-dimensional form, can to be re-written in the form $$T = \frac{1}{2}\omega_G^T I^G \omega_G + \frac{1}{2}\omega_F^T(I^F + I^M)\omega_F + \frac{1}{2}\dot{u}^2$$ (8)

$$U = \frac{1}{2}k_\theta\theta^2 + \frac{1}{2}k_\psi\psi^2 + \frac{1}{2}k_u u^2 - M_\psi\psi - F_u u$$ (9)

$$F = \frac{1}{2}c_\theta\dot{\theta}^2 + \frac{1}{2}c_\psi\dot{\psi}^2 + \frac{1}{2}c_u\dot{u}^2$$ (10)

Here the overdot () denotes derivatives with respect to the non-dimensional time, t. It should be noted that equations 8-10 utilize the non-dimensional quantities shown Table 1.

In order to preserve an option to control the stiffness of the drive mode, $k_\psi^0$ may differ from $k_\psi$. It should be noted that the ability to control the stiffness of the drive mode may allow tuning of the drive mode frequency to compensate uncertainties caused by fabrication. All parameters corresponding to the moments of inertia are normalized by $I_0$ and all the angular velocity related quantities are normalized by the natural circular frequency $\omega_0 = 1/t_0$ (as shown in equation (6)) of the free undamped tilting vibrations of the frame 30 around the ζ-axis (i.e. the drive mode). Substitution of equations (8), (9), (10) into Lagrange equations leads to a system of three coupled nonlinear differential equations in terms of u(t), ψ(t) and θ(t) describing the dynamics of the system 10.

In order to illustrate the operational principle of the sensor of the present invention and provide an insight into the structure behavior, several simplifying assumptions are adopted and several particular cases are considered. It should be noted that these assumptions can actually describe the rotation sensor system according to some embodiments of the present invention as will be described below. First, (i) the moment inertia of the frame 30 is assumed to be small compared to that of the proof mass and can be thus be neglected, i.e., $I^F=0$ (or, alternatively, that $\hat{I}^M$ is viewed as a combined moment of inertia of the frame and of the proof mass); (ii) the gimbal is symmetric with respect to the x and y axes and $I_x^G=I_y^G=I^G$. It should be noted that preferably the mass of the frame 30 is much smaller than the combined mass M of the proof mass elements 20, and that according to some embodiments of the present invention the entire sensor system is designed to be symmetric, i.e. the gimbal is symmetric. Next, the proof mass is assumed to have a shape of a ring with an extensible (stretchable) axis, this assumption can manifest itself in the system according to some embodiments is that the proof masses 20 are arranged is a circular symmetric fashion around the axis of rotation ζ. As a result of the symmetry of the proof mass with respect to the x and y axes, equations of motion of the structure 10 can be significantly simplified to be more convenient for analysis. On the other hand, the simplified structure and its model still demonstrate the leading dynamic phenomena taking place in this kind of system and thus describe operation of the system.

Figure 3B:
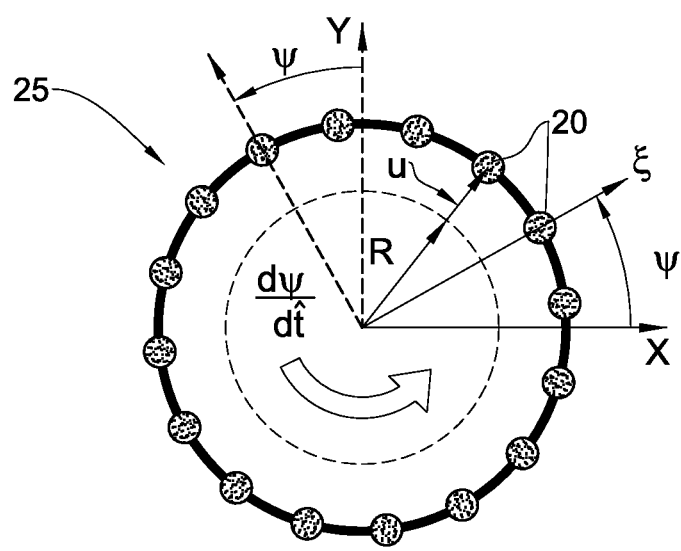

Reference is made to FIGS. 3A-3B illustrating a ring shaped arrangement of a proof mass assembly 25 in which the proof mass elements 20 are assembled in a circular fashion around an axis of rotation ζ. According to the configuration, the proof mass assembly 25 is in the form of a large number of point masses 20 arranged to form a ring with an initial radius R. FIG. 3A illustrates the ring shaped proof mass assembly 25 where the proof mass elements 20 are located closer to the center of the frame (not shown here), in an undeformed configuration, while FIG. 3B illustrates the assembly 25 when the proof mass elements 20 are located at a larger distance from the center of the frame (in a deformed configuration).

The total mass of all proof mass elements 20 is considered to be M. The mass elements 20 are constrained to move synchronously in the ξ-η plane along the radial direction in such a manner that when the proof mass elements 20 are closer to the center the radius is R and when the mass elements 20 are further from the center (deformed) the radius of the ring is R+û. It should be understood that since the total mass M of the ring is preserved during the deformation, the "density" (the mass per unit length) of the ring actually varies to be m=M/(2π(R+û)). Each of the mass elements 20 is preferably attached to the frame by an elastic connector (e.g. spring) having certain damping factor. The connectors are configured to provide an actuation force acting on the mass elements 20 of the proof mass assembly in the radial direction to thereby move the mass elements 20 from the central location (R) to the periphery location (R+u). The total stiffness of the springs $\hat{k}_u$, the total damping coefficient $\hat{c}_u$ and the total force $\hat{F}_u$ applied on the mass elements 20 affect potential energy (9) and for the Rayleigh's dissipation function and thus are determined in accordance with the rotation frequency of the frame and the total mass of assembly 25 to enable the operation of the system.

In symmetry configuration of the proof mass assembly 25 (i.e. ring-like arrangement of proof mass elements 20), the moments of inertia of the proof mass assembly with respect to the x, y, z coordinate system associated with the frame (30) are not influenced by its rotation and the moment of inertia tensor elements are $\hat{I}_{xx}^M = \hat{I}_{yy}^M = m\pi(R+\hat{u})^3 = M(R+\hat{u})^2/2$ and $\hat{I}_{zz}^M = 2m\pi(R+\hat{u})^3 = M(R+\hat{u})^2$. As a result, $I_0 = MR^2$, r=R and the non-dimensional moments of inertia of the proof mass assembly are given by:

$$I_{xx}^M = I_{yy}^M = I^M = \frac{1}{2}(1+u)^2, \quad I_{zz}^M = (1+u)^2 \quad (11)$$

The non-dimensional kinetic energy of the ring and of the gimbal can therefore be described by the expression:

$$T = \frac{1}{2}(I^G + I^M)(\omega_x^2 + \omega_y^2) + \frac{1}{2}I_{zz}^G\omega_z^2 + \frac{1}{2}I_{zz}^M\omega_\zeta^2 + \frac{1}{2}\dot{u}^2 \quad (12)$$

where the angular velocities $\omega_x, \omega_y$ and $\omega_\zeta$ are given by equations (1) and (2), respectively. The potential energy is given by equation (9) and the dissipation function is given by equation (10). Utilizing these expressions to derive the Lagrange equations provides the equations of motion in terms of u(t), ψ(t) and θ(t):

$$\ddot{u} + c_u\dot{u} + k_u u - \frac{1}{2}(1+u)(\omega_x^2 + \omega_y^2 + 2\omega_\zeta^2) = F_u \quad (13)$$

$$\frac{d}{dt}(I_{zz}^M\omega_\zeta) + c_\psi\dot{\psi} + k_\psi\psi = M_\psi \quad (14)$$

$$\frac{d}{dt}[(I^G + I^M)\omega_x] - (I^G + I^M)\omega_y\omega_z + \\ (I_{zz}^G\omega_z + I_{zz}^M\omega_\zeta)\omega_y + c_\theta\dot{\theta} + k_\theta\theta = 0 \quad (15)$$

Equations (13), (14), (15) include time-dependent moments of inertia $I^M, I_{zz}^M$ which are given by equation (11), and angular velocities $\omega_x, \omega_y, \omega_z, \omega_\zeta$ given by equations (1) and (2). These equations of motion serve as basis for the dynamic analysis of the system of the present invention as described below.

In order to explore the structure behavior and provide simple description thereof, the above system of three coupled nonlinear differential equations (13), (14), (15) was re-written in the form of the system of first order nonlinear ordinary differential equations in the form:

$$\dot{q} = F(q, \dot{q}, t) \quad (16)$$

and was solved numerically using a multistep solver ode 15 s integrated into Matlab package. In equation (16), q={u,u̇,ψ, $\pi_\psi,\theta,\pi_\theta,$}$^T$ is the vector of state variables and F is a nonlinear function. It should be noted that since the mass matrix of the system is time dependent and may have discontinuities (e.g., when the proof mass elements are switched between two positions). The generalized momenta $\pi_\psi = I_{zz}^M\Omega_\zeta$ and $\pi_\theta = (I^G + I^M)\omega_x$ associated with the rocking and the tiling motions, respectively, were chosen as the state variables instead of ψ̇ and θ̇. Expressing $\pi_\psi$ and $\pi_\theta$ in terms of the components of q gives:

$$F_1 = q_2 \quad (17)$$

$$F_2 = -c_u q_2 - k_u q_1 + \frac{1}{2}(1+q_1)\left[\left(\frac{q_6}{I^G + I^M}\right)^2 + \omega_y^2 + 2\left(\frac{q_4}{I_{zz}^M}\right)^2\right] + F_u \quad (18)$$

$$F_3 = \frac{q_4}{I_{zz}^M} - \omega_z \quad (19)$$

$$F_4 = -c_\psi\left(\frac{q_4}{I_{zz}^M} - \omega_z\right)k_\psi q_3 + M_\psi \quad (20)$$

$$F_5 = \frac{q_6}{I^G + I^M} - \Omega_X \quad (21)$$

$$F_6 = (I^G + I^M)\omega_y\omega_z - (I_{zz}^G\omega_z + q_4)\omega_y - c_\theta\left(\frac{q_6}{I^G + I^M} - \Omega_X\right) - k_\theta q_5 \quad (22)$$

here $I^M, I_{zz}^M$ are given by equation (11) with u replaced by $q_1$; $\omega_y, \omega_z$ are given by equations (1) with θ replaced by $q_5$.

The rotation sensor device of the present invention may also operate in modes where the proof mass assembly has time-independent moment of inertia and can rotates with the angular velocity ψ̇ around the z-axis. In these modes of operation equations (14) and (15) are reduced to the equations describing the dynamics of a spinning disk gyro with a disk-shaped proof mass of radius √2R and of the mass M. The analysis of the spinning disk gyro is largely reflected in the literature and is briefly presented here for completeness.

When the displacement of the proof mass elements is unchanged, i.e. setting u=0 (and therefore $\dot{I}^M$=0, $\dot{I}_{zz}^M$=0) in equations (14) and (15) and $k_\psi$=0, $c_\psi$=0, $M_\psi$=0 in equation (14) (i.e. assuming that a sufficient torque $M_\psi = c_\psi \dot{\theta}$ is applied to the proof mass assembly in order to preserve the rotation speed), the following preservation equations are received:

$$I_{zz}^M \dot{\omega}_\zeta = 0 \qquad (23)$$

$$(I^G+I^M)\dot{\omega}_x - (I^G+I^M)\omega_y\omega_z + (I_{zz}^G\omega_z+I_{zz}^M\omega_\zeta)\omega_y + c_\theta\dot{\theta} + k_\theta\theta = 0 \qquad (24)$$

By integrating equation (23), the generalized momentum is obtained to be $\pi_\psi = I_{zz}^M \omega_\zeta$=const. Thus by substituting the generalized momentum $I_{zz}^M \omega_\zeta$ into equation (24) and recalling that $\dot{\Omega}_X$=0 (and, therefore, $\omega_x = \dot{\theta}$, see equation (1)), results in $$(I^G+I^M)\ddot{\theta} + c_\theta\dot{\theta} + k_\theta\theta - (I^G+I^M-I_{zz}^G)\omega_y\omega_z + \omega_y\pi_\psi = 0 \qquad (25)$$

Since $\omega_y$, $\omega_z$ are functions of $\theta$ (see equation (1)) and $\psi$=const, equation (25) has a steady-state solution in terms of $\theta$. Using the common assumptions that $\theta \le 1$, $\Omega_x \le 1$, $\Omega_y \le 1$, $\Omega_z \le 1$ (and therefore, $\Omega_z\theta \le 1$) and neglecting the squares of the angular rate, the steady tilting angle of the gimbal is as follows:

$$\theta_{st} = -\frac{\Omega_Y \pi_\psi}{k_\theta} \qquad (26)$$

According to equation (26) the angular rate $\Omega_Y$, being the angular rate of the platform to which the sensor is attached, can be extracted from the measurement of $\theta_{st}$ and the structure of the present invention thus provides a measurement for angular rate. It should be noted that in the spinning disk gyro, the drive and the sense modes are in a sense dynamically decoupled since the disk rotation and consequently all the perturbations related to it (e.g., structural coupling arising due to the non-ideality of the suspension) occurs at the frequency much higher than the gimbal frequency.

Due to the elasticity of the suspensions (connectors) connecting the frame 30 to the gimbal 40, $k_\psi \ne 0$, the unidirectional rotation of the frame 30 is precluded and the proof mass assembly performs vibratory rocking motion around the z-axis. In this case, the structure of the present invention is operated similarly to conventional vibratory wheel gyroscope, with rocking drive mode and tilting sensing mode. In addition to setting u=0, equations (14) and (15) are simplified by assuming low angular deflection and angular rates, i.e. $\theta \le 1$, $\Omega_X \le 1$, $\Omega_Y \le 1$, $\Omega_Z \le 1$:

$$I_{zz}^M \ddot{\psi} + c_\psi \dot{\psi} + k_\psi \psi - I_{zz}^M \Omega_Y \dot{\theta} = M_\psi^0 \sin(\omega t) \qquad (27)$$

$$(I^G+I^M)\ddot{\theta} + c_\theta\dot{\theta} + k_\theta\theta + I_{zz}^M \Omega_Y \dot{\psi} = 0 \qquad (28)$$

where $M_\psi^0$ and $\omega$ are, respectively, the amplitude and the frequency of the harmonic actuation torque applied to the frame 30. The system of equations (27) and (28) represents the simplest model of a generic single-mass two degrees of freedom vibratory gyro. Two natural modes of this system, which are coupled only due to the skew-symmetric gyroscopic matrix proportional to the angular rate $\Omega_Y$, are commonly referred to as a drive mode ($\psi$) and a sense mode ($\theta$).

Further simplification of equation (27) is commonly made by neglecting the term $I_{zz}^M \Omega_Y \dot{\theta}$ in this equation. This simplification is justified, since for low angular rates, the amplitude of the sense mode is significantly smaller than that of the drive mode. In this case equation (27) is decoupled from equation (28) and its steady-periodic solution has the form $\psi(t) = A_\psi \cos(\omega t - \phi_\psi)$, where $A_\psi$ and $\phi_\psi$ are the amplitude and the phase of the drive mode response, respectively. Substituting this solution into equation (28):

$$(I^G+I^M)\ddot{\theta} + c_\theta\dot{\theta} + k_\theta\theta = I_{zz}^M \Omega_Y \omega A_\psi \sin(\omega t - \phi_\psi) \qquad (29)$$

The steady-periodic response describe by equation (29) has the form $\theta(t) = A_\theta \cos(\omega t - \phi_\theta)$, where the amplitude $A_\theta$ of the sense mode is proportional to the product $\Omega_Y A_\psi$. By measuring $A_\theta$, the angular rate can be extracted due to the controllable frame vibration amplitude $A_\psi$.

The vibratory gyro rotation sensors of the present invention are fully compliant structures which can be fabricated using micromachining technologies. Since the typical angular rotation to be measured $\Omega_Y$ is relatively small, the achievement of measurable responses is possible only under resonant operation and in the low damping (high quality factor Q) environment. It should be noted that in the configurations were the proof mass assembly has constant moment of inertia, the forced response of the device in both drive and sense modes corresponds to a harmonic motion. And that in these configurations the averaged angular momentum of the proof mass assembly and of the gimbal are zero.

The rotation sensor according to various embodiments of the present invention can operate according to operational principle combining features of both spinning disk gyro and vibratory gyro. Similarly to the spinning disk gyros, it is distinguished by a non-zero average angular momentum of the proof mass assembly and has an ability to extract the angular rate from the steady tilting angle of the gimbal. On the other hand, the structure is a fully compliant structure suspended using elastic flexures (connectors) and with a proof mass assembly performing a vibratory motion. The structure can be viewed therefore as a "pseudo spinning disk" gyro. These features are achieved by the implementation of the concept of the structure having time-varying inertial properties.

In contrast to the case of the spinning disk, the generalized momentum $\pi_\psi = I_{zz}^M \omega_\zeta$ of the structure 10 is not constant. The generalized momentum contains a time-dependent component and generally can be represented as having a constant component and a time varying component in the form:

$$\pi_\psi = \pi_\psi^0 + \tilde{\pi}_\psi(t) \qquad (30)$$

where $\pi_\psi^0$ is the steady component of the generalized momentum and $$\tilde{\pi}_\psi(t) = \int(-c_\psi \dot{\psi} - k_\psi \psi + M_\psi) dt \qquad (31)$$

is the time-dependent component. The periodic solutions of the system of equations (13), (14) and (15) are of interest such that u(t), $\psi$(t), $\theta$(t) are periodic functions. In addition, the dusplacement of the proof mass elements and the angular orientation of the frame (and of the proof mass assembly) u(t), $\psi$(t) have a zero average. Thus in accordance with equations (1) and (2), the angular velocities of the gimbal $\omega_x$, $\omega_y$, $\omega_z$ are periodic (Under the assumption that the angular rate $\Omega$ of the platorm rotation, i.e. the rate to be measured, is time-independent). In addition, equation (31) suggests that for $k_\psi$=const, $c_\psi$=const and a time-periodic $M_\psi$(t), $\tilde{\pi}_\psi$(t) are periodic functions with zero average. Averaging the terms of equation (30) over a rotation period of the vibrating/rocking frame T=$2\pi/\omega$, where $\omega$ is the frequency of the driving moment $M_\psi$ (the frequency of the rocking motion of the drive mode around the z-axis), the steady component of the momentum is:

$$\pi_\psi^0 = \langle \pi_\psi \rangle = \frac{1}{T} \int_0^T I_{zz}^M \omega_\zeta \, dt \qquad (32)$$

the operator < > used here and further used below denotes averaging over the rocking period. It should be understood that in the case of a time-dependent moment of inertia $I_{zz}^M$, the averaged generalized momentum is not zero. In contrast, in the case of a vibratory gyro with $I_{zz}^M$=const, $\langle \pi_\psi \rangle$=0, whereas in the spinning disk gyro, $\pi_\psi$=$\langle \pi_\psi \rangle$=const.

Substituting $\pi_\psi$ from equation (30) into equation (15), averaging it over the rocking period and taking into consideration that $\pi_\theta$=$(I^G+I^M)\omega_x$, is periodic, results in:

$$\int_0^T \frac{d}{dt}[(I^G + I^M)\omega_x] \, dt = 0 \qquad (33)$$

and the averaged equation is:

$$\langle (I_{zz}^G - I^G)\omega_y \omega_z \rangle - \langle I^M \omega_y \omega_z \rangle + \langle \pi_\psi \omega_y \rangle + k_\theta \langle \theta \rangle \rangle = 0 \qquad (34)$$

It should be noted that similarly to the case of the spinning disk gyro, equation (34) has a steady solution. However, in contrast to the spinning disk gyro, this solution is in terms of average angular deflection <θ> and is influenced by the averaged fast components of the response.

Considering the case of the small angular rate of the platform (the rate to be measured), i.e. $\Omega_Y \leq 1$, $\Omega_Z \leq 1$, substituting equation (30) into equation (34) and setting $\omega_y = \omega_y^0 + \tilde{\omega}_y(t)$, where $\omega_y^0$ and $\tilde{\omega}_y$ are the steady and fast (periodic and zero average) components respectively, and neglecting the squares of the angular rate results in the expression:

$$\langle \pi_\psi^0 \omega_y^0 \rangle + \langle \tilde{\pi}_\psi \tilde{\omega}_y \rangle + k_\theta \langle \theta \rangle = 0 \qquad (35)$$

In the case of small angular deflections $\theta \leq 1$ (and thus $\Omega_z \theta \leq 1$), and $\omega_y \approx \Omega_Y$, $\langle \tilde{\pi}_\psi \omega_y \rangle \approx \langle \tilde{\pi}_\psi \rangle \Omega_y = 0$ the averaged tilting angle of the gimbal is given by the expression:

$$\langle \theta \rangle = -\frac{\Omega_Y \langle \pi_\psi \rangle}{k_\theta} \qquad (36)$$

which is similar to equations (26), but with θ and $\pi_\psi$ replaced by their averaged values.

Since in accordance with equation (36) the scale factor of the device is $d\langle\theta\rangle/d\Omega_Y = \langle \pi_\psi \rangle / k_\theta$, sensitivity requirements may dictate high frequency of the rocking motion and low stiffness $k_\theta$ of the connectors (e.g. suspension spring) connecting the rocking frame to the gimbal, and consequently low natural frequency of the gimbal (of the sense mode). In this case $\omega A_\psi \geq \Omega_Z$ and equations (13), (14) and (15) can be simplified by replacing $\omega_\zeta \approx \dot\psi$. It should be noted that this assumption, which is commonly used in the analysis of vibratory gyros, is equivalent to neglecting the influence of the angular rate on the drive mode vibrations. Finally, simplified equations (13), (14) and (15) take the form (recalling that $\theta \leq 1$, $\Omega_X \leq 1$, $\Omega_Y \leq 1$, $\Omega_Z \leq 1$)

$$\ddot{u} + c_u \dot{u} + (k_u - \dot\psi^2)u = F_u + \dot\psi^2 \qquad (37)$$

$$\frac{d}{dt}[(1+u)^2 \dot\psi] + c_\psi \dot\psi + k_\psi \psi = M_\psi \qquad (38)$$

$$\frac{d}{dt}\left[\left(I^G + \frac{1}{2}(1+u)^2\right)(\Omega_X + \dot\theta)\right] + c_\theta \dot\theta + k_\theta \theta = -\Omega_Y(1+u)^2 \dot\psi \qquad (39)$$

It can be understood that the equation of the drive mode (38) is decoupled from the equation of the sense mode (39) and is not influenced directly by the angular rate. However, it is coupled to equation (37) since the drive mode response is influenced by the radial motion of the proof mass assembly. It should be also noted that in the case of u≡0 and $\omega_\theta \geq Q_X$, where $\omega_\theta$ is the non-dimensional fundamental frequency of the gimbal in the initial undeformed configuration, equations (38) and (39) are reduced to equations (27) and (28) describing the conventional vibratory gyro. The full equations (13), (14) and (15) are used for the numerical analysis while the simplified equations (37), (38) and (39) are used for the evaluation of approximate analytical estimation of the averaged responses.

While equation (36) provides a general approximate relation between the angular rate and the averaged tilting angle, it cannot be directly used for calculation of $\langle \theta \rangle$, since $\langle \pi_\psi \rangle$ still has to be found by solving two coupled equations (37) and (38). In order to simplify the calculations, u(t) can, in this connection, be considered to be a dependent variable, being a prescribed function of time or of the angular velocity $\dot\psi$ of the rocking frame motion. Specifically, the scenario when the radial displacement of the proof mass elements is given by the expression:

$$u = \mu \, \text{sign}(\dot\psi) \qquad (40)$$

where μ is the amplitude of modulation/displacement of the proof mass elements.

In accordance with equation (40) the proof mass elements generally are switched/shifted between two different positions 1+μ and 1−μ with respect to the axis of the rocking frame, depending on the direction of the drive mode motion. This situation can be realized by actively controlling the position of the proof mass elements or by using switchable bistable suspension elements.

As describe above, the moments of inertia of the proof mass assembly are:

$$I^M = \frac{1}{2}(1 \pm \mu)^2, \qquad I_{zz}^M = (1 \pm \mu)^2 \qquad (41)$$

where the signs "+" and "−" correspond to the two configuration fo the proof mass assembly which are typically swhiched in accordance with the rocking motion, e.g. when $\dot\psi > 0$ and $\dot\psi < 0$, respectively.

To simplify matters, the stiffness $k_\psi$, the damping coefficient $c_\psi$ and the actuating moment $M_\psi$ may be considered as being controlled in accordance with the same rule, i.e.:

$$k_\psi = (1 \pm \mu)^2, \; c_\psi = c_\psi^0 (1 \pm \mu)^2, \; M_\psi = (1 \pm \mu)^2 M_\psi^0 \sin(\omega t) \qquad (42)$$

It should be noted that the tuning of the connectors' stiffness can routinely be achieved in microsystems, for example, by applying an electrostatic force or by heating the suspension elements of the connectors. This is while tunable damping is less common and more difficult to realize, in principle, it can be achieved using feedback control algorithms.

It should be understood that the model problem incorporating time-varying stiffness and damping is considered here for convenience since it simplifies the evaluation of a compact analytic solution. Time-dependent stiffness and damping are not necessary conditions for the appearance of the non-zero averaged momentum, and thus the rotation sensor system according to the present invention may or may not utilized controlled stiffness of the elastic suspensions (connectors).

In view of the above described simplified assumptions, equation (38) takes the form:

$$(1\pm\mu)^2\ddot{\psi}+c_\psi^0(1\pm\mu)^2\dot{\psi}+(1\pm\mu)^2\psi=(1\pm\mu)^2 M_\psi^0 \sin(\omega t) \quad (43)$$

and, within each interval where $\text{sign}(\dot{\psi})=\text{const}$ can be reduced to the equation of a forced damped harmonic oscillator, whose solution is:

$$\psi(t)=A_\psi \sin(\omega t-\phi_\psi) \quad (44)$$

where $A_\psi$ and $\phi_\psi$ are the amplitude and the phase of the drive mode vibrations, respectively. It should be noted that in order to achieve maximal amplitude of the drive mode, the drive mode is typically actuated as close as possible to its resonance frequency. Substituting this result into equation (32) and replacing $\omega_\zeta \approx \dot{\psi}$ in $\pi_\psi = I_{ZZ}^M \omega_\zeta$ (the phase in equation (44) may be chosen in such a way that $\psi(0)=-A_\psi$ and $\dot{\psi}(0)-0)$ $$\langle \pi_\psi \rangle \approx \frac{1}{T}\left(\int_0^{T/2}(1+\mu)^2 \dot{\psi}\, dt + \int_{T/2}^T (1-\mu)^2 \dot{\psi}\, dt\right) = \frac{4\mu\omega A_\psi}{\pi} \quad (45)$$

Substituting this result into equation (36) the steady averaged tilting angle of the gimbal is described by:

$$\langle \theta \rangle = -\frac{4\mu\Omega_Y \omega A_\psi}{\pi k_\theta} \quad (46)$$

Since $k_\theta=(\frac{1}{2}+I^G)\omega_\theta^2$, equation (46) can be re-written in a more
convenient form $$\langle \theta \rangle = -\frac{8\mu A_\psi}{\pi(1+2I^G)}\left(\frac{\Omega_Y}{\omega_\theta}\right)\left(\frac{\omega}{\omega_\theta}\right) \quad (47)$$

The output of the sense mode, as given from the above equation is proportional to the measured rotation $\Omega_Y$ and to the amplitude of the drive mode (rocking motion) $A_\psi$. However, in contrast to the vibrational device and similarly to the spinning disk gyro, this sense mode output has a steady component. Moreover, equation (47) introduces an additional control parameter, the modulation depth $\mu$. It should be noted that in accordance with equation (40), the estimation of equation (47) corresponds to the largest possible 50% duty cycle of the mass switching. However, the duty cycle and phase of the switching can be changed actively to serve as additional control parameters, as will be illustrated below.

Now consider the case when the proof mass elements are forced to move harmonically in accordance with the equation $$u(t)=\mu \sin(\omega t-\phi_u) \quad (48)$$

where $\phi_u$ is the phase between the motion of the proof mass and forcing moment (rocking motion) of the drive mode $M_\psi=M_\psi^0 \sin(\omega t)$. In this case, assuming that the response of the drive mode is given by equation (44) and replacing $\omega_\zeta \approx \dot{\psi}$ the average momentum is given by $$\langle \pi_\psi \rangle \approx \frac{1}{T}\int_0^T (1+\mu\sin(\omega t-\phi_u))^2 \dot{\psi}\, dt = \mu\omega A_\psi \sin(\phi_\psi - \phi_u) \quad (49)$$

Substituting equation (49) into equation (36) yields $$\langle \theta \rangle = -\frac{2\mu A_\psi}{(1+2I^G)}\left(\frac{\Omega_Y}{\omega_\theta}\right)\left(\frac{\omega}{\omega_\theta}\right)\sin(\phi_\psi - \phi_u) \quad (50)$$

According to equation (50) the average momentum $\langle \pi_\psi \rangle$ and the average tilt of the gimbal $\langle \theta \rangle$ are maximal when the phase difference is $\phi_\psi - \phi_u = \pi/2$. In accordance with equations (49), (50) the magnitude and even the sign of the average momentum and of the tilting angle can be changed by controlling the phase of the proof mass motion. This feature may provide various additional operational modes for the rotation sensor system according to the present invention. For example, the system may be configured to extract the external angular rate by measuring the phase of the proof mass assembly $\phi_u$, which is required in order to keep $\langle \theta \rangle$ to be equal to a certain (but non-zero) value. This "phase re-balance" approach may provide high sensitivity of the angle to the phase. It should be noted that the condiguration of the system of the present invention may provide that the angle of the gimbal is influenced (for the given geometry and the angular rate and for the case of resonant excitation when $\omega$ is close to unity) by three controlled parameters—the amplitude of the rocking motion (drive mode) $A_\psi$, the displacement of the proof mass elements $\mu$ and the phase between the rocking motion and the proof mass elements' shift $\phi_u$. In contrast, in the conventional vibratory gyro, only one parameter, namely the amplitude of the drive mode, $A_\psi$, can be actively controlled.

Numerical results illustrating different operational scenarios of the structure for rotation sensor system accordong to the present invention utilizing time-dependent moment of inertia are describde in the following FIGS. 4A-4C and FIGS. 5A-5C. The numerical simulations considered the motion of the proof mass elements, and the location thereof u as described according to the system of four equations shown in equations (19)-(22). The moments of inertia of the gimbal were taken to be two times smaller than corresponding moments of inertia of the proof mass assembly in the undeformed state, i.e., $I^G=\frac{1}{4}$, $I_{zz}^G=\frac{1}{2}$ (see equation (11)). All calculations for the cases of a constant angular rate were performed for $\Omega_Y=10^{-4}$. The values of the damping coefficients $c_\psi^0 2\zeta_\psi$ and $c_\theta=2\zeta_\theta\sqrt{k_\theta(I^G+I^M)}$ were selected such that $\zeta_\psi=0.005$ in equation (20); larger damping of $\zeta_\theta=0.05$ is introduced in equation (22). It should be noted that in some embodiments, the actual structure may be operated in air. In such configurations the tilting (sense mode) motion of the gimbal is typically more influenced by a squeeze film damping, originated in a thin air film between the tilting body and the substrate, than the drive mode or the proof mass motions. In addition, the numerical calculation adopted $\omega=1$, $\omega_\theta=0.05$ and zero initial conditions.

Figure 4A:
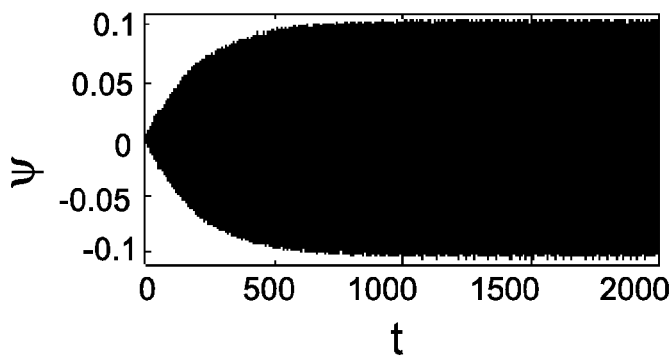
FIGS. 4A-4C show result of numerical simulations illustrating the technique of operation used in the present invention.
Figure 4B:
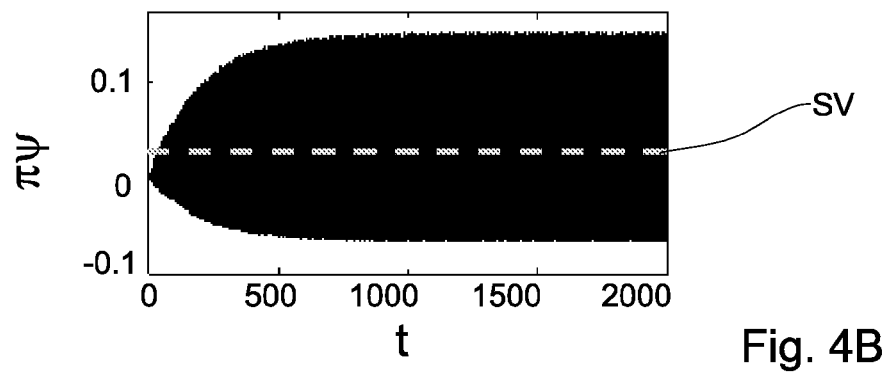
Figure 4C:
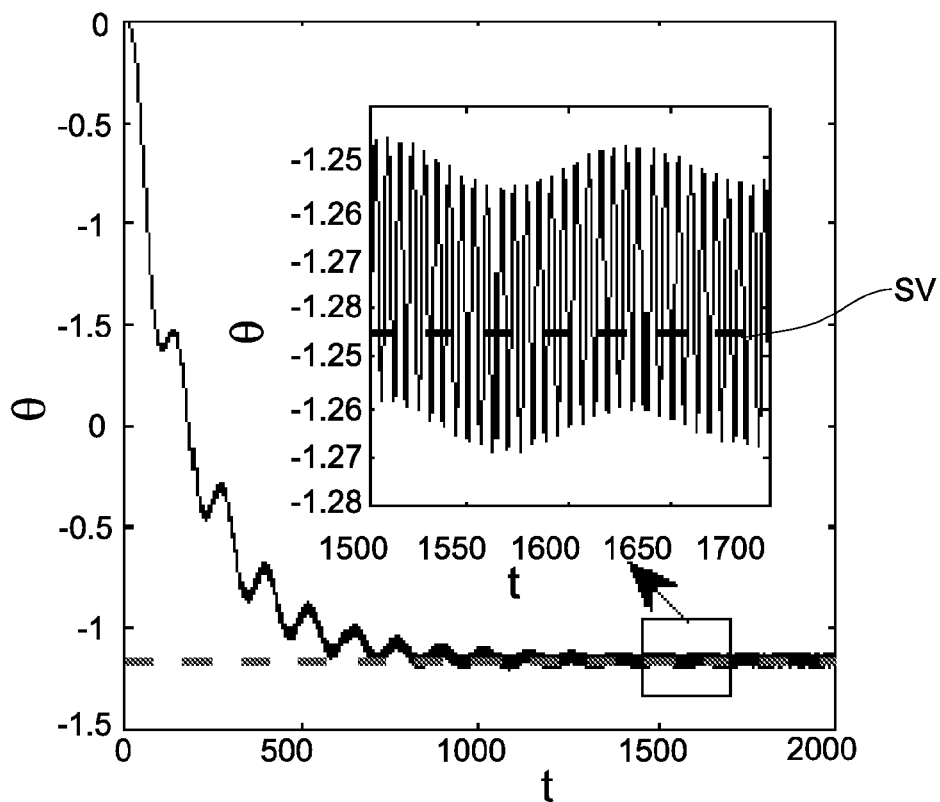

Reference is made to FIGS. 4A to 4C illustrating temporal variations of the the drive mode, which in this example constituted by the rocking angle $\psi$ (FIG. 4A), the generalized momentum $\pi_\psi$ (FIG. 4B) and the gimbal tilting angle $\theta$ (FIG. 4C) of the structure having a time-dependent moment of inertia. These results are associated with operation of the proof mass assembly in accordance with equation (40) where μ=0.2. Dashed lines SV shown in FIGS. 4B and 4C illustrate an approximations of the static values for the momentum and tilt angle as given by equation (45) and equation (47), respectively. FIGS. 4A-4C illustrate principles of operation of a rotation sensor system configured with a proof mass assembly wherein the radius defined by the proof mass assembly 1 is switched between two values 1±u (or R±u), where the mass displacement u is given by equation (40) and μ=0.2. The angular velocities other than the rocking motion of the frame are zero, i.e. $\Omega_X=\Omega_Z=0$. In addition, the drive mode stiffness $k_\psi$, damping coefficient $c_\psi$, and actuation moment $M_\psi$ are in accordance with equation (42).

As seen from these figures, although the angular velocity of the rocking frame ψ(t) has a zero average, the average generalized momentum, associated with this angular velocity, is not zero, and the gimbal tilts due to external angular rotation. The gimabl may oscillate around the tilt angle θ determined by equation (47) (with $A_\psi$ extracted from the numerical results), however it still provides an excellent approximation for the average tilt angle ⟨θ⟩ with the relative error of err=|(<θ>−<$\theta_{num}$>)/<$\theta_{num}$>|=0.017%. Where <$\theta_{num}$> is the gimbal angle obtained by averaging of the numerical time series over multiple periods. The relative error in the averaged momentum resulting from equation (45) (with respect to the averaged numerical value) is 0.28%. The influence of $\Omega_X$ and $\Omega_Z$ on <θ> was found to be minor for small angular rates: for $\Omega_X=\Omega_Y=\Omega_Z=10^{-4}$ when ω=1 the static angle can be approximated by equation (47) with accuracy of 0.1%.

It should be noted that as a result that the vibrations of the gimbal $\omega_\theta$ around the average tilt angle θ is largely de-tuned from the driving mode frequency of the frame. This results in that the amplitude of the time-dependent component of the sensor system response (of the tilting angle θ) is much smaller than the steady averaged value of the angle. This amplitude reflects the low level of the response, which would be obtained in a conventional vibratory gyro operated in the off-resonance regime. In contrast, the much larger steady value of the angle θ is insensitive to the mismatch between the frequencies and can be efficiently used for the extraction of the angular rate. Moreover, the time-dependent component of θ has zero average and therefore has minor influence on the measured averaged steady value. This fact may result in significant improvement of the structure performance since all high-frequency components of the sensing mode response, including those originating in the structural coupling, are averaged out and the sensor system operates similarly to a spinning disc gyroscope.

Figure 5A:
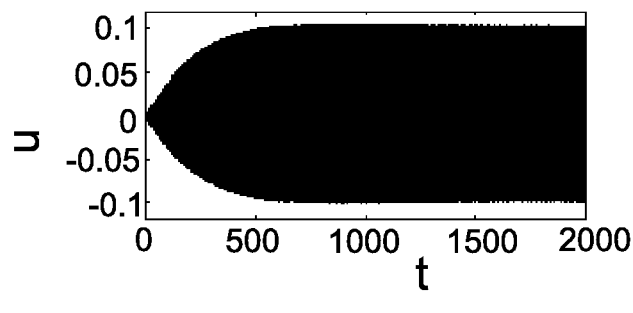
FIGS. 5A-5C show additional numerical simulations illustrating the technique of operation used in the system of the present invention.
Figure 5B:
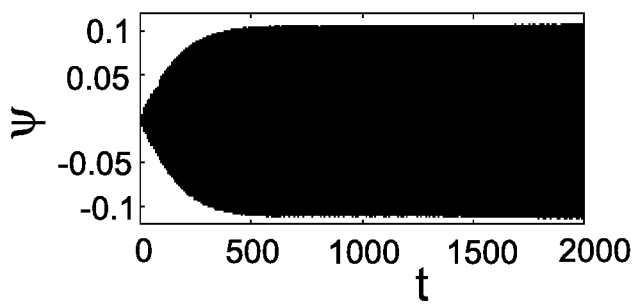
Figure 5C:
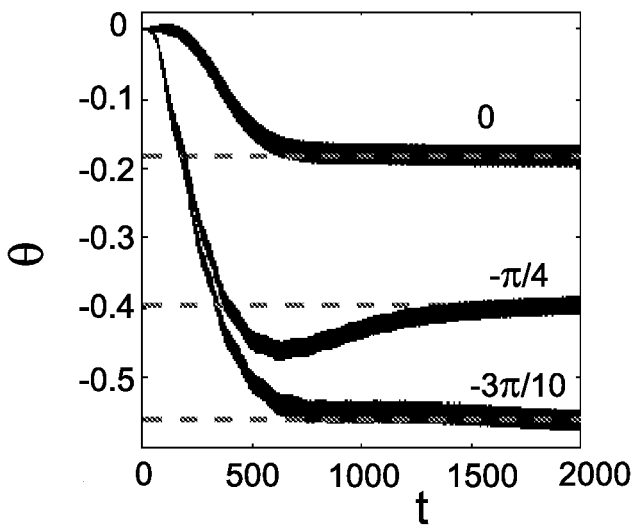

Equation (50) suggests that ⟨θ⟩ is affected not only by the amplitude of modulation of the moment of inertia of the proof mass assembly, but also by the relative phase between the displacement of proof mass elements and the rocking motion of the frame. In this connection, reference is made to FIGS. 5A-5C showing simulation results exemplifying a dependence of the tilt angle ⟨θ⟩ of the gimbal on the relative phase between the displacement of proof mass elements and the rocking motion of the frame.

The proof mass assembly is actuated by a harmonic force in the form of $F_u=F_u^0 \sin(\omega_F t-\phi_F)$. The forcing frequency $\omega_F$ of the proof mass assembly is chosen to be equal to the natural frequency thereof and to the frequency of the rocking motion of the frame, i.e. $\omega_u=\sqrt{k_u}=\omega$, which in this example equals 1. FIG. 5A shows the displacement of the proof mass elements, FIG. 5B shows the angle of rotation of the frame and FIG. 5C shows the tilt angle of the gimbal for three different phases $\phi_F-\phi_u$ between the proof mass assembly motion and the frame rocking motion. These figures show that the response of the system to external angular rotation can be tuned by varying the phase difference between the rocking of the frame and the displacement of the proof mass elements. Additionally, the system of the present invention may provide an operational scheme based on static/constant tilt angle while the measurable parameter may be the phase difference between the rocking of the frame and the displacement of the proof mass elements. According to this scheme the system operates to maintain the required tilt angle by appropriately varying the phase between the drive mode of the frame and of the proof mass assembly and upon identifying the corresponding phase difference, the value of the external angular is determined.

It should be noted that although the present inventon is configured and aimed at improving the static sensing mode due to ability to achieve a non-zero angular momentum, it also allows operation of angular rate sensors based on new schemes for the operation in a conventional vibratory gyro scenario. For example, the dependence of the tilting angle on the amplitude and phase of the proof mass can be used for dynamic excitation of the sense mode through intermodulation. In particular, when the radial drive motion of the proof mass assembly is in accordance with the expression $$u(t)=\mu(1+\nu \sin(\omega_\theta t))\sin(\omega t-\phi_u) \quad (51)$$

where, specifically, ν=μ and ω=1 and the phase $\phi_u$ is preferably selected such that $\phi_\psi-\phi_u \approx \pi/2$. The amplitude modulation of the moment of inertia of the proof mass results in modulation of the rocking motion amplitude at the same frequency ($\omega_\theta$) and thus in resonant excitation of the gimbal. Despite large resonant amplitudes of the gimbal, the averaged value of the tilt angle is non-zero <θ>≠0 and is predicted by equation (50) with satisfying accuracy. Additionally, drive fo the proof mass assembly may be modulated in the phase rather than in the amplitude, i.e driving the proof mass assembly in accordance with the experession:

$$u(t)=\mu \sin(\omega t-(1+\nu \sin(\omega_\theta t))\phi_u) \quad (52)$$

Similarly to the case of the amplitude modulation, the phase modulation results in the slow-frequency resonant excitation of the gimbal vibrations around an averaged tilt angle value. However, in the case of the phase modulation, the approximation of equation (50) is not valid and can be considered as an upper limit of the averaged value of the tilt angle.

It should be noted that a large variety of scenarios of amplitude and/or phase modulation of the drive mode can be implemented. For example, in the case of the zero average amplitude modulation when the proof mass assembly is driven according to $$u(t)=\mu\nu \sin(\omega_\theta t)\sin(\omega t-\phi_u) \quad (53)$$

the gimbal is excited at its resonant frequency while its average tilt angle is close to zero. In such scenario, the amplitude of the gimbal vibration is affected by the external angular rate $\Omega_Y$ which can thus be detected. This type of excitation can be used for the operation of the system (structure) in alternating modes or as a vibratory gyro. The central advantage of the intermodulation-based approach relative to standard vibratory gyros is that the system of the rpesent invention can be configured such that the frequencies of the drive mode and of the sense mode are well separated. This reduces the challenge of matching between the drive and sense mode frequencies. In addition the de-tuning between the drive and sense frequencies may result in smaller structural coupling. This also provides the system with a possibility to utilize very small amplitudes u of the drive mode driving the proof mass assembly while actuating the rocking motion of the frame.

Figure 6E:
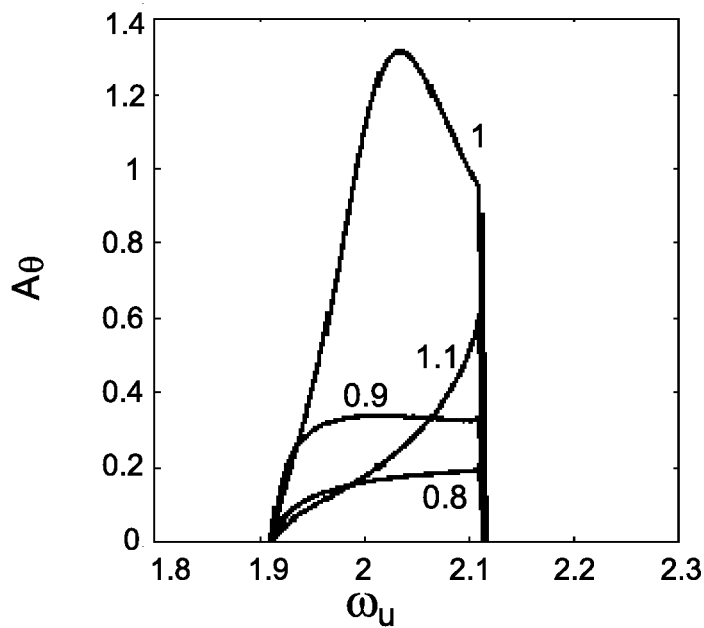

Alternatively the system may be operated according to one other actuation scenario based on excitation of the rocking frame vibrations through parametric resonance mechanism. Equations (14), (15) as well as simplified equations (38), (39) show that since the mass coefficient in these equations is time-dependent, the equations may provide a scheme of parametric character. Equations (14) and (38), describing the dynamics of the drive mode, are homogeneous and pure parametric excitation is realized by periodic changing of the inertial terms at the frequencies within the range of parametric resonance. Equations (15), (39), corresponding to the sense mode, contain a direct forcing term incorporating the angular rate $\Omega_Y$ to be measured. In this operational scheme, the drive mode utilizes time-dependent moment of inertia and drives the motion of the proof mass is in accordance with Eq. (54). In this connection reference is made to FIGS. 6A-6D showing simulation results exeplifying paramteric excitation fo the rocking frame by appropriate vibratory movement of the proof mass assembly. FIG. 6A shows the drive mode angle of the rocking frame, FIG. 6B shows the tilt angle of the gimabl (sense mode angle) in mrad and FIGS. 6C-6D show respectively resonant curves of the drive mode and of the sense mode (in mrad) for different values of proof mass displacement $\mu$; and FIG. 6E show the sense mode angle resonant curves (in mrad) for the case of matched ($\omega_\theta=1$) and slightly de-tuned ($\omega_\theta=0.8,0.9,1.1$) drive and sense mode frequencies were the proof mass displacement is $\mu=1$. It should be noted that the value of $\psi$ as shown in FIG. 6A along time provide a substantially triangular profile (i.e., the velocity $\dot\psi$ during the motion). This character of motion can be beneficial in various applications, e.g., in scanning mirrors configured to scan a regions of interest by periodically deflecting light incident thereon into different location along a scan-line.

The results shown in these figures correspond to the case of well separated drive and sense mode frequencies such that $\omega_\theta=0.05$ were $\omega_\psi=1$. The proof mass assembly is forced to vibrate at frequency equal to twice the natural frequency of the rocking motion, i.e., $$u(t)=\mu \sin(\omega_u t-\phi_u) \quad (54)$$

where in this example $\omega_u=2$ and $\phi_u=-0.3025\pi$. The actuating moment was taken to be zero, i.e., $M_\psi=0$, whereas a small non-zero initial condition $\psi(0)-0.0001$ was introduced to initialize vibrations in the otherwise symmetric system. Since in linear systems the amplitude of the vibrations within the region of parametric resonance is unbounded, even in the case of non-zero damping, an additional nonlinear term $k_\psi \psi^3$ was added to Eq. (14) and consequently to (21) in order to get a bounded response. It should be noted that the stiffening associated with the added non-linear term can be realized in micro systems by means of appropriate design, e.g., by tailoring the electrodes configuration or by incorporating mechanically nonlinear elements.

FIGS. 6C-6E show resonance curves for the drive FIG. 6C and the sense FIG. 6D modes. FIG. 6E show sense mode resonant curves for the case of matched ($\omega_\theta=1$) and slightly de-tuned ($\omega_\theta=0.8, 0.9,1.1$) drive and sense mode frequencies for the case of $\mu=0.1$. It can be seen from the figures that the parametric excitation can take place in a wide range of the proof mass excitation frequencies $\omega_u$, while the matching between the frequencies of the proof mass assembly $\omega_u$, the rocking frame $\omega_\psi=1$ and the gimbal tilt frequency $\omega_\theta$ is not necessary to achieve parametric excitation. This feature is beneficial in the angular rate sensors (e.g. micro gyros) where the drive mode is parametrically excited by a specially tailored electrostatic force. Utilizing the structure described herein for the system of the present invention efficient parametric excitation may be achieved through the inertia, rather than stiffness, modulation.

Figure 7:
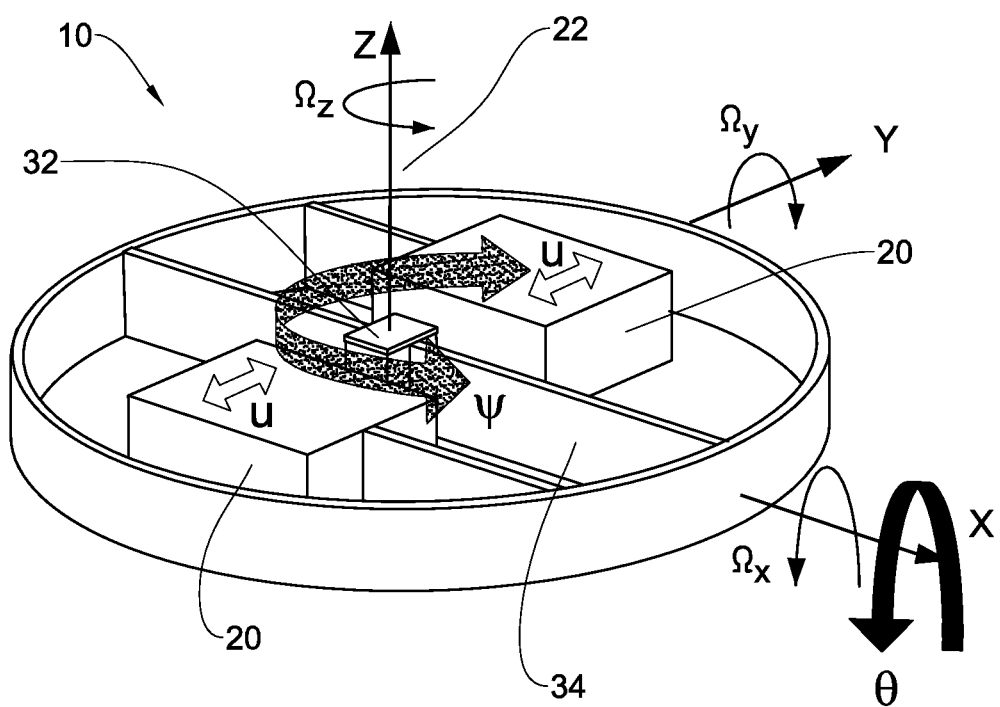
FIG. 7 schematically illustrates architecture of an angular rate sensor system according to embodiments of the present invention.

Reference is now made to FIG. 7, illustrating an angular rate sensor system 10 according to the present invention. The system 10 includes a rotatable frame 30 which is connectable onto a gimbal such that the frame is rotatable about the Z axis 22 around an anchor point 32. It should be noted that the frame 30 may be connectable to a separate gimbal or be configured to operate as both the rocking frame and gimbal. A proof mass assembly including two proof mass elements 20 is connected to the frame such that a distance between the mass elements 20 and the rotation axis 22 is adjustable. The gimbal is typically configured to be rotatable about a certain axis, which in this example is selected to be the X axis, at least one of corresponding to the reference frame to be measured. The angular velocities describing rotation of the platform to which the system may be mounted are marked by $\Omega_X$, $\Omega_Y$ and $\Omega_Z$. As described above, the location of the proof mass elements 20 is adjusted with respect to the rotation axis 22 of the frame 30 in order to enable variations of the moment of inertia of the frame 30, alternatively or additionally, the location of the proof mass elements may provide for parametric excitation of the rocking motion of the frame or adjusting the resonance rocking frequency of the frame 30. It should be noted that the proof mass elements 20 are connected to the frame 30 by one or more elastic connectors 24 having certain stiffness and certain dumping coefficient. To this end the connectors may be described as springs, spring-like or beam-like connectors. Additionally the rotatable frame 30 is pivotally connected the anchor pivot 32 by elastic connector 34 providing certain stiffness and dumping coefficients.

Figure 8A:
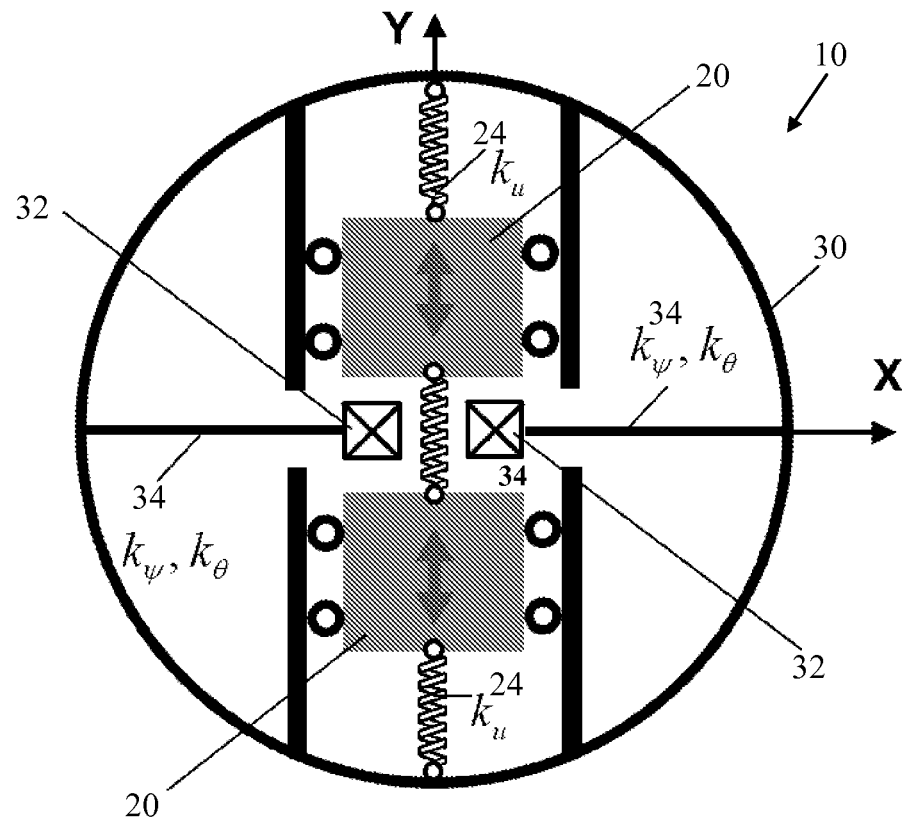
FIGS. 8A-8B illustrate respectively configuration of an angular rate sensor in its relaxed, initial form, (FIG. 8A) and in its deformed form (FIG. 8B) according to some embodiments of the present invention.
Figure 8B:
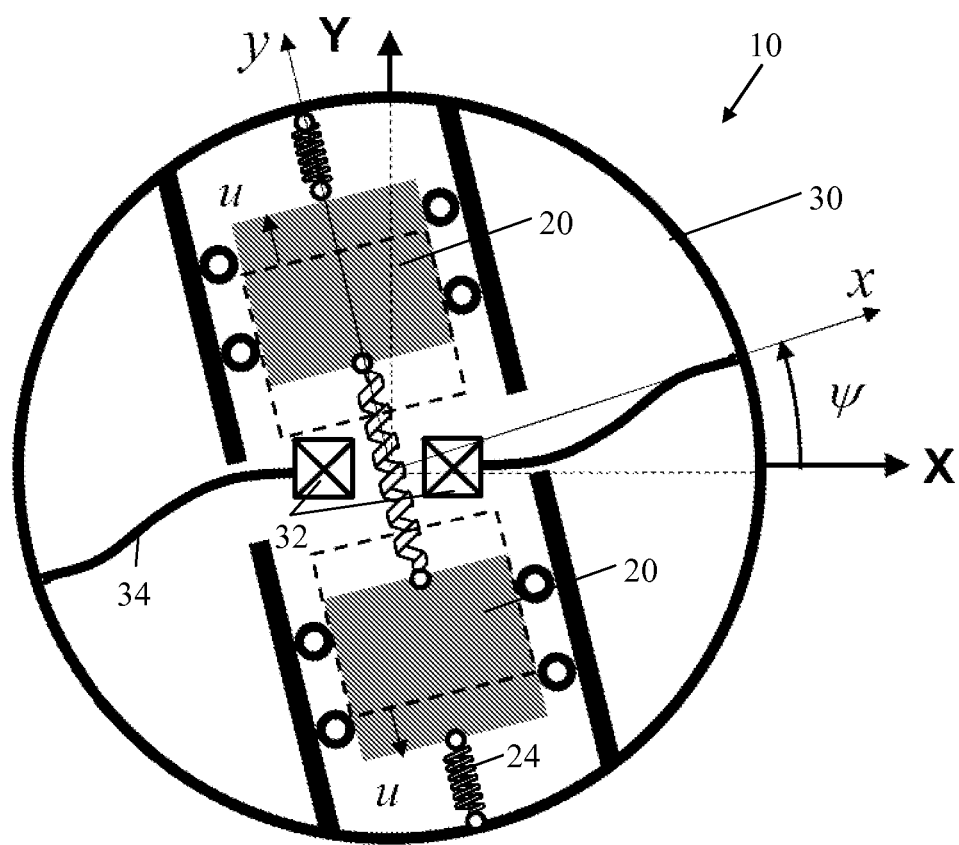

Reference is now made to FIGS. 8A to 8B showing in more details a configuration a sensor system 10 in the natural and deformed configurations respectively. The system 10 includes a rotatable frame 30 connected by flexible connectors 34 to an anchor pivot 32 being configured as one or more anchors, in this example the frame 30 is pivotally anchored to two anchors 32. The proof mass assembly includes two movable proof mass elements 20 connected by spring-like connectors 24 to the frame such that a distance between the proof mass elements and an axis of rotation of the frame 30 can be adjusted utilizing e.g. one or more electrodes (not specifically shown) providing varying electric field to thereby attract or repel the proof mass elements 20. As shown in FIG. 8B, when the rotatable frame 30 is shifted about the rotation axis, the connectors 34 pivotally connecting the frame to the anchor(s) 32 are deformed providing both elastic force pushing the frame back to the original orientation and dumping force restraining the rocking motion of the frame 30. Electric field, generated by one or more electrodes (not shown) may be operated to force the frame to rotate at a predetermined frequency defining the drive mode frequency. As also shown in FIG. 8B, the proof mass elements 20 may be moved utilizing additional electrodes (not specifically shown) to there by provide variations of the moment of inertia of the proof mass assembly and thus of the rotating frame 30. According to other schemes of operation, the movement of the proof mass elements 20 may be used for parametric excitation of the frame 30 rotation to thereby enable detection of external angular rate. Alternatively or additionally, location of the proof mass elements 20 with respect to the rotation axis may be used for fine-tuning of the rocking frequency of the frame 30.

As indicated above, with reference back to FIGS. 1A-1B, the trajectories 26 of the proof mass elements 20 enable the system to provide non-zero angular momentum while performing rotation motion. According to some operation schemes of the system, the shift frequency of the proof mass assembly and the rocking frequency of the rotating frame 30 are matched such that at one part of the rotation the proof mass elements 20 are located further from the axis and during the other part of the rotation the proof mass elements are closer to the axis. This motion actually creates a close loop trajectory for each of the proof mass elements which exhibit a certain non-zero angular momentum. The combination of the entire proof mass assembly, i.e. the combined trajectories of all the proof mass elements 20, provides average non-zero angular momentum of the system and thus enables detection of external angular movements.

Figure 9:
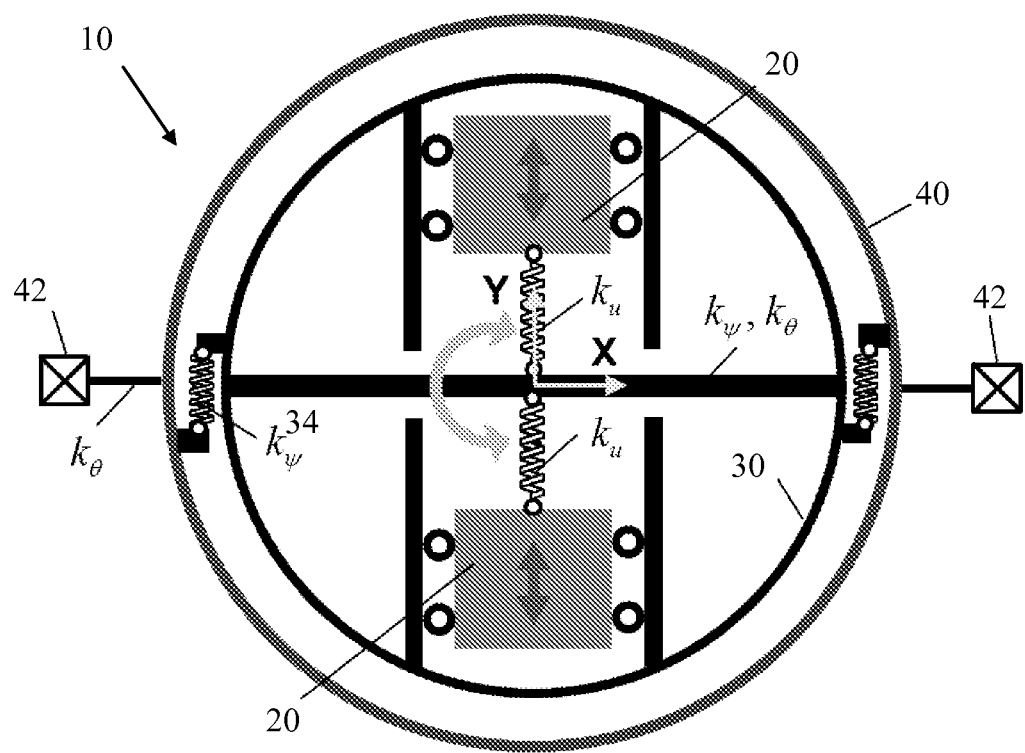
FIG. 9 illustrates one other configuration of the angular rate sensor according to embodiments of the present invention in relaxed (initial) form.

The rotating frame of the angular rate sensor system 10 is typically configured to be mounted on an external frame (gimbal) which is free to rotate about one or two axes intersecting with the axis of rotation of the rotating frame. FIG. 9 illustrates sensor system 10 including a rotatable frame 30 connected to two proof mass elements 20 in a similar fashion as the example of FIGS. 8A-8B. The rotating frame 30 is connected by two (generally one or more) flexible connectors 34 to the external gimbal 40, which in this configuration provide the pivotal anchor for the rotation of the frame. The external gimbal 40 is connectable to a platform (e.g. device, vehicle, micro-satellite etc.) as a gimbal by two hinges 44, connected to two anchors 42, and thus is rotatable about an axis connecting the two anchors 42. It should be noted that the gimbal 40 may preferably be rotatable about the X-axis collinear with the direction of the hinges (in the undeformed position) intersecting with the axis of rotation of frame 30. In this case the angular rate to be measured is the rotation of the platform about the Y axis.

Figure 10:
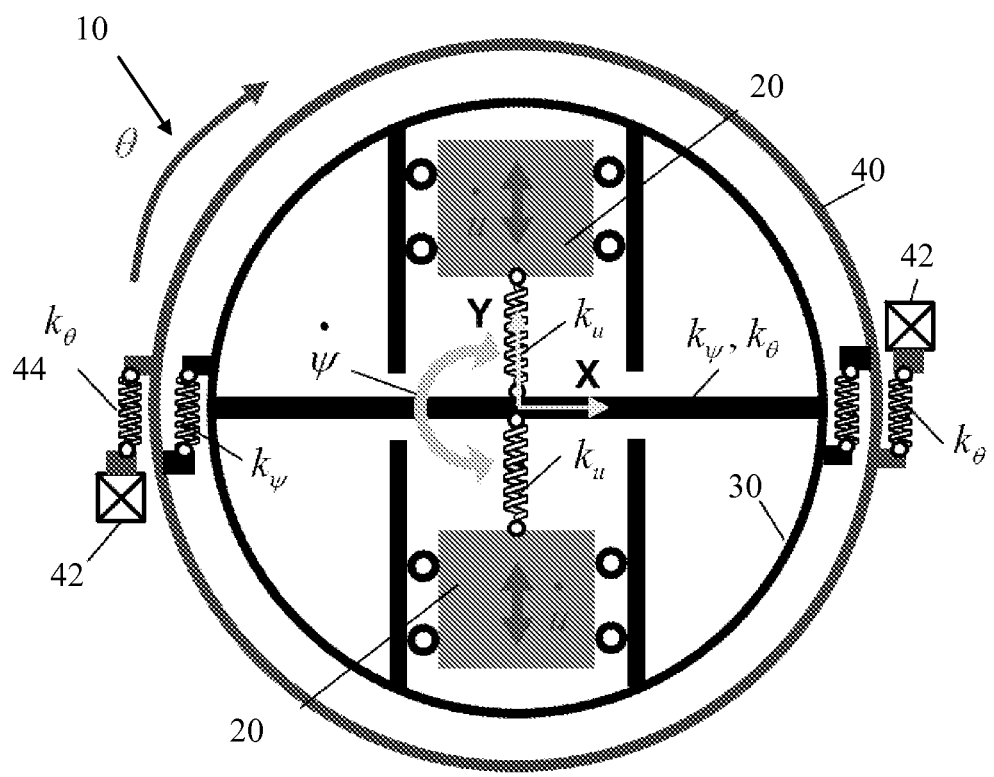
FIG. 10 exemplifies a configuration of a compliant actuator system according to some embodiments of the present invention.

The device of the present invention, utilizing controllable moment of inertia, can also be used in large deflection micro actuators. One such possible implementation is shown in FIG. 10 illustrating an actuator system 10. The device 10 contains an internal frame 30 configured to perform in-plane tilting motion about the Z-axis with angular velocity $\dot{\psi}$. The rotatable frame 30 is connected to an external frame 40 by springs 34 (or spring like connectors). The external frame 40 may be attached to a substrate/platform by elastic springs 44 (elastic connectors) connecting the external frame 40 to two anchors 42. The elastic springs 44 allow the external frame 40 to perform tilting motion about Z-axis. The natural frequency of the external frame 40 is typically designed to be much lower than the rotation frequency of the internal frame 30. To this end, during the tilting motion of the internal frame 30, the two proof mass elements 20 are moved (shifted) along a radial direction in such a way that the averaged angular momentum of the tilting frame about Z-axis is not-zero, preferably the shift of the proof mass elements is configured to provide a certain average non-zero angular momentum. The rotation of frame 30 transfers the momentum to the external frame 40 which is then forced to rotate by the angle 6. Since the natural frequency of the external frame 40 is configured to be relatively low, the high frequency events of the angular moment transfer result in a quasi-static deflection of the external frame 40. Small amplitude high-frequency vibrations are superimposed on the static deflection. The static angle can be controlled by changing the amplitude or/and frequency of the rotation of the internal frame 30 as well as by the changing the duty cycle of the variations (change) in the moment of inertia (this actually represents a PWM-like mode of operation). Moreover, the direction of static angle can be changed by changing the pattern of the proof mass elements' 20 motion (the phase between the masses motion and the frame motion) during the cycle of vibration. For example, if during the half period corresponding to the counterclockwise rotation of the internal frame the mass is switched to its outer (larger distance from the Z-axis) position (as seen in FIG. 1B) and to its inner (smaller radius) position during the second half period, the averaged angular momentum is counterclockwise and the rotation of the external frame is counterclockwise as well. In contrast, if the mass switching is shifted in such a way that it is in an outer position during the clockwise rotation of the internal frame (the direction opposite to shown in FIG. 1), the external frame will rotate to the clockwise direction.

The technique of the present invention is focused in micro electro mechanical sensors, and as described above may provide a micro sensor having a pseudo spinning disc effect. Reference is made to FIGS. 11A-11C and further to FIGS. 12A-12B, FIGS. 13A-13B, FIG. 14 and FIGS. 15A-15C all exemplifying different designs of angular rate sensor systems, also capable to operate as actuators according to embodiments of the present invention and designed to provide micro scale system. While the system of FIGS. 11A-11C is typically configured such that the proof mass assembly is within a plane perpendicular to the axis of the rocking motion of the frame, the systems of FIGS. 12A-12B, FIGS. 13A-13B, FIG. 14 and FIGS. 15A-15C are configured such that the proof mass elements are located within a plane parallel to the axis of rotation, but the distance between the proof mass elements and the axis of rotation is adjustable.

In FIGS. 11A-11C the rotating frame is configured as a micro structure 10 having two massive parts providing the proof mass elements 20 and relatively flexible connector defining the frame 30 and providing elasticity and stiffness. FIG. 11A shows the structure in its relaxed configuration and FIG. 11B show the structure in its deformed configuration. The structure 10 is connected to an anchor 32 by two connectors 34 and is rotatable about an axis perpendicular to the plane of the structure 10. The location of the proof mass elements 20, and their distance from the anchor 32, is adjustable by applying electric field by two electrodes 55, configured to attract the proof mass elements 20. In the present example the electrodes 55 are configured to be in a circular shape. This shape allows to preserve distance between the mass and the electrode and therefore the value of the electrostatic force to be unaffected by the rotation of the frame.

FIG. 11C illustrates a part of the structure 10 exemplifying an approach allowing tuning of the bending stiffness of the beam-like elastic suspension 34 (or any other element of the structure 10) by means of the application of an electrostatic force. The force is provided by two electrodes 58 symmetrically located at two sides of the beam.

Figure 12A:
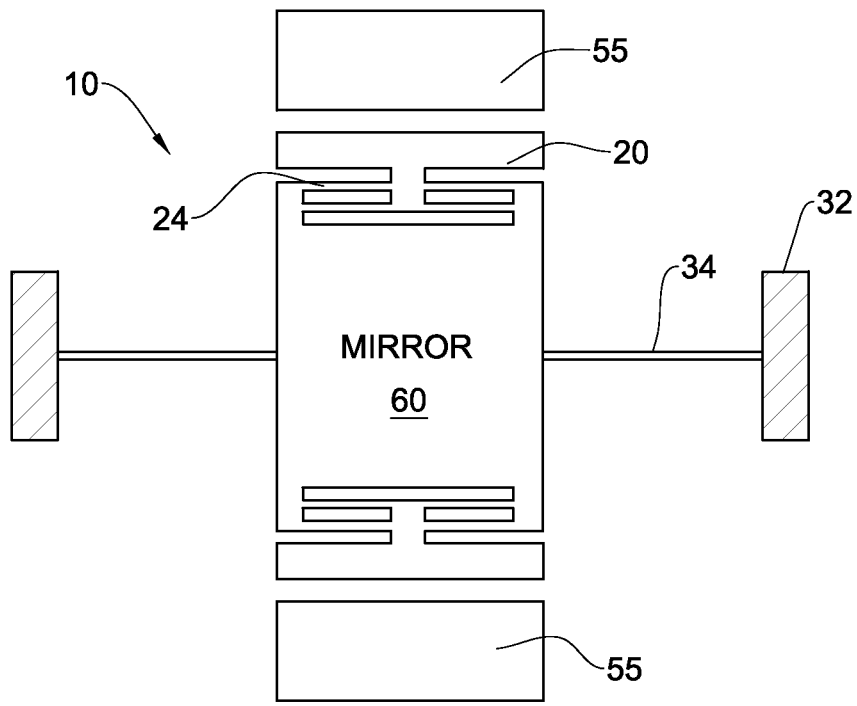
FIGS. 12A-12B show respectively configurations of a planar (single layer) parametrically excited tilting micro actuator in the relaxed (initial) and deformed configurations.
Figure 12B:
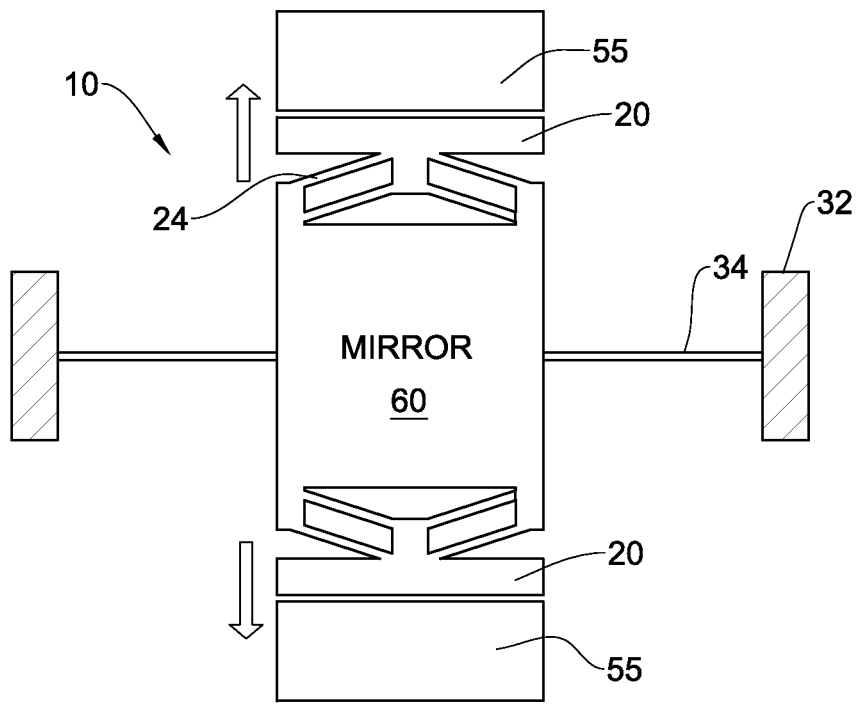

FIGS. 12A-12B illustrate one other configuration of structure 10, wherein the proof mass assembly, and generally the structure 10 itself, is arranged within a plane being parallel to the axis or rotation. This configuration may be used when the system utilizes optical detection of the tilt angle by detecting a light beam reflected/deflected from the structure. Alternatively or additionally it can be used as a resonant tilting (scanning) micro mirror. The structure 10 is based on a rotatable frame, which may be coated/covered with an optically reflective surface 60, elastically attached to two proof mass elements 20 and pivotally connected by elastic torsion axis 34 to two anchor points 32. Electrodes 55 are configured to adjust the location of the proof mass elements 20 by applying electric field as indicated above. It should be noted that the distance between the mass elements 20 to the axis of rotation is the parameter which affects the moment of inertia, while the exact location of the mass elements 20 along the axis of rotation does not change the moment of inertia.

The structure shown in FIGS. 12A-12B can also be used for efficient parametric excitation of the tilting vibrations of the planar structures using modulation of the moment of the inertia of the device 10 around the tilting axis (the axis collinear with the torsion elastic hinges 34). In this case the motion of the masses 20 is provided at the frequency which is twice the resonant frequency of the structure 10. It should be noted that the deformation of the structure shown in FIG. 12B, which does not include rotation of the entire structure, exemplify parametric actuation of the structure to thereby efficiently rotate the frame at a predetermined frequency.

Figure 13A:
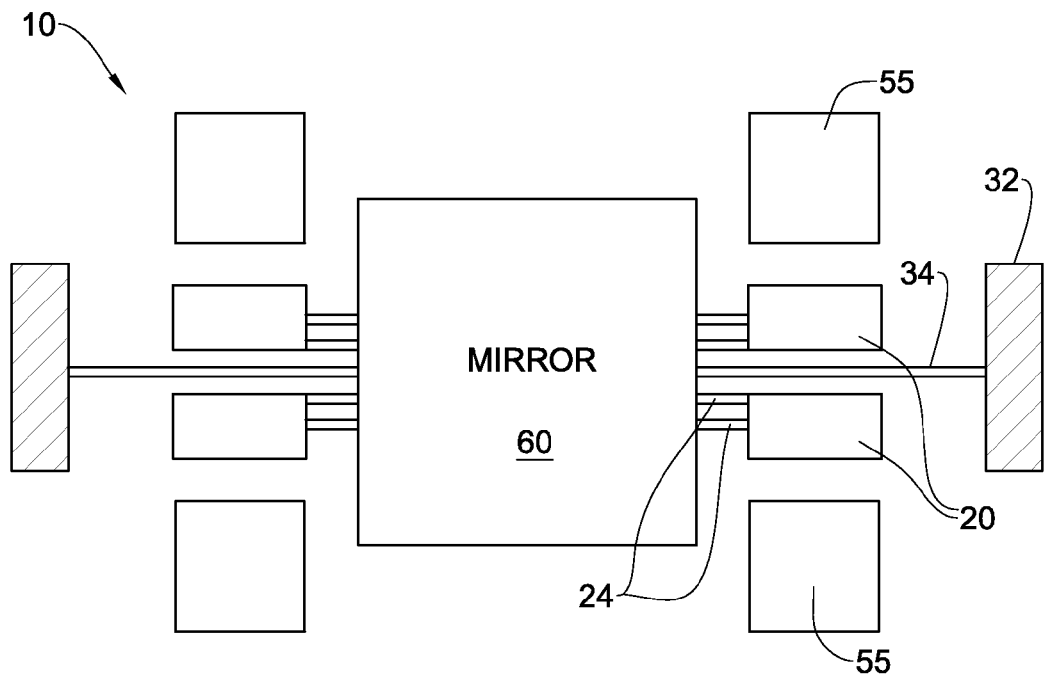
FIGS. 13A-13B illustrate one other configuration of a planar (single layer) parametrically excited tilting micro actuator in the relaxed, initial, (FIG. 13A) and deformed (FIG. 13B) configurations according to the present invention.
Figure 13B:
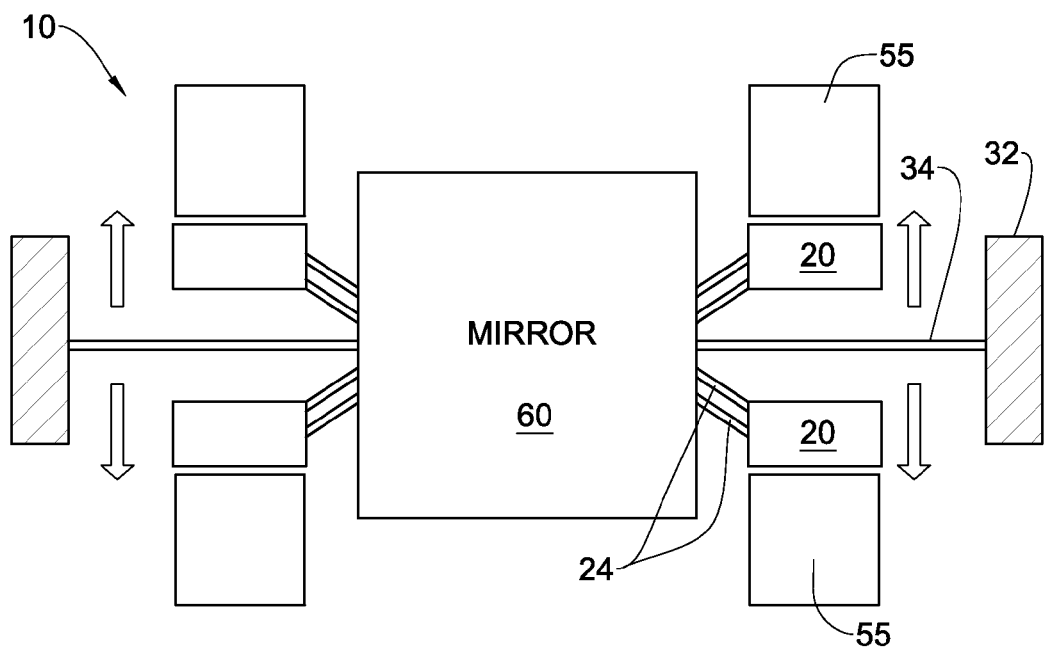
Figure 14:
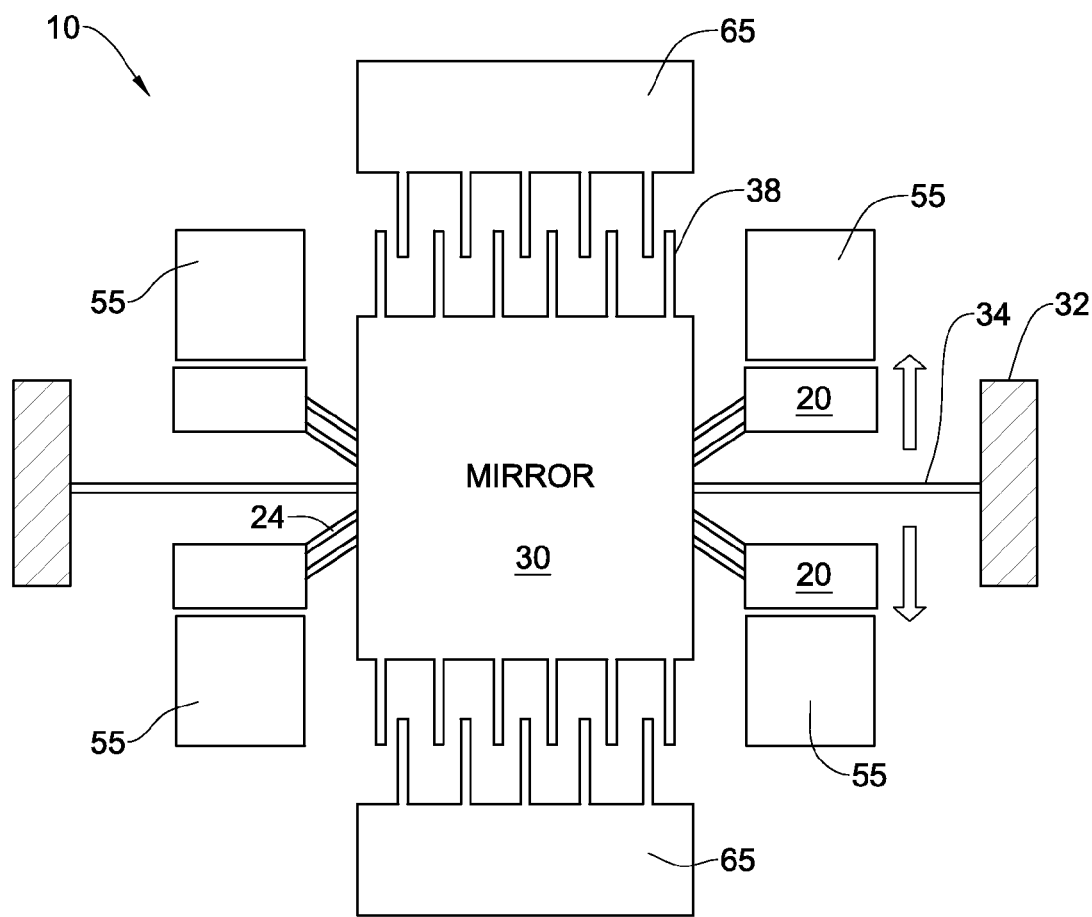
FIG. 14 illustrates one other planar (single layer) tilting micro actuator simultaneously excited by means of variable moment of inertia and by an electrostatic force.

FIGS. 13A-13B and FIG. 14 illustrate an example of the structure 10 configured with four mass elements 20, while the structure is configured as a planar structure located within a plane parallel to the axis of rotation. As shown in FIG. 14, additional electrodes 65 may be located in close proximity to the rotating frame 30 and configured to provide electric field to thereby directly actuate the rotation of the frame. In this example the tilting plate (frame 30) is excited simultaneously using parametric excitation by varying the moment of inertia and directly by applying the electrostatic force using electrode 65. This combination allows realization of parametric amplification of the tilting amplitudes, when linear resonant excitation using electrostatic force is parametrically pumped using variable moment of inertia.

Figure 15A:
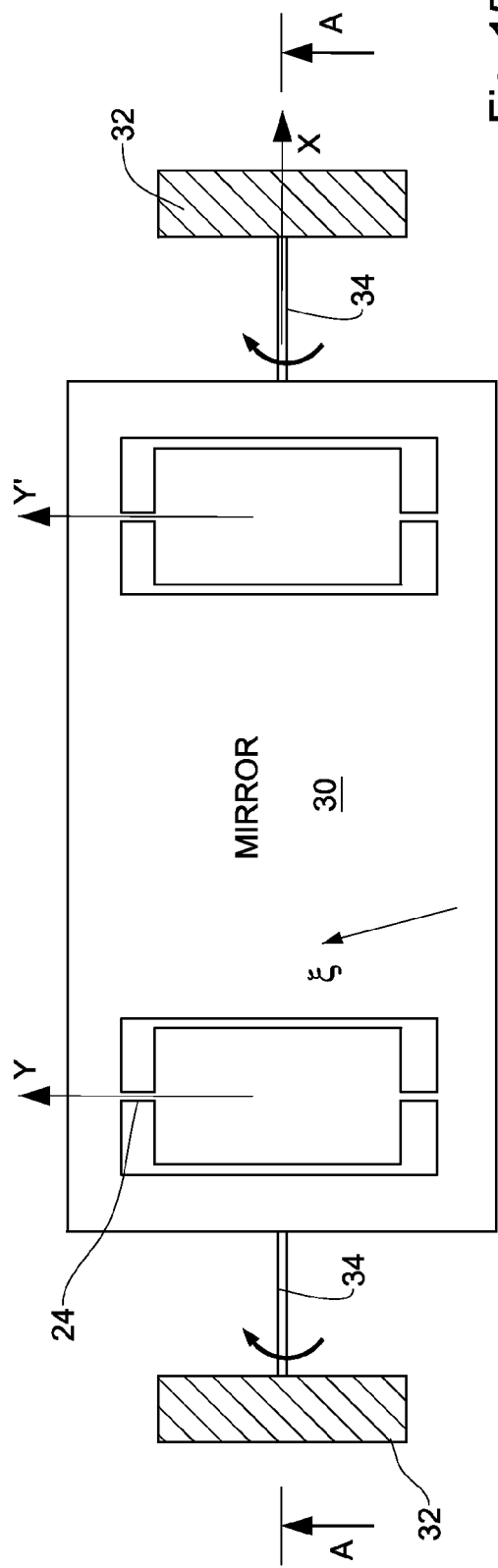
FIGS. 15A-15C exemplify one other approach for enabling variation of the moment of inertia within a planar (single layer) tilting device configured as an actuator or angular rate sensor.
Figure 15B:
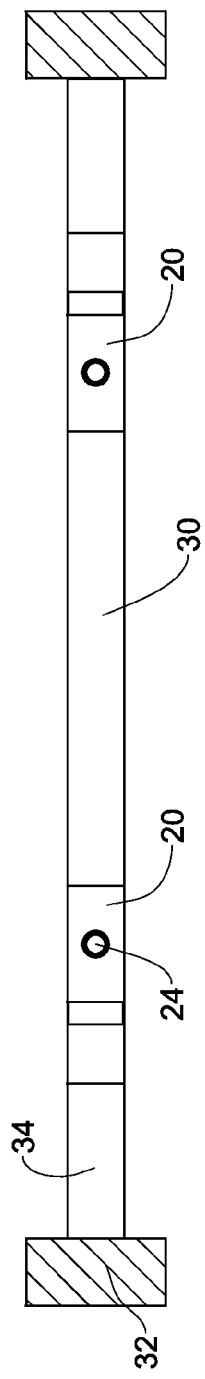
Figure 15C:
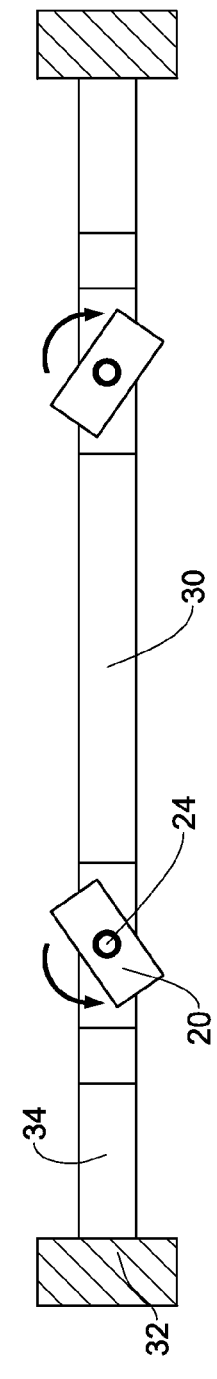

FIGS. 15A-15C show yet another configuration of structure 10 allowing variation of the moment of inertia according to different embodiments of the invention. FIG. 15A shows the planar structure 10 outside of its plane, while FIGS. 15B and 15C show respectively the structure in its normal and deformed configurations from within the plane of the structure. The structure 10 contains a tilting plate (frame) 30 configure to rotate about the x-axis. The frame 30 is attached to the anchors 32 by two elastic torsion hinges 34. One or more additional plates 20 are attached to the frame by torsion hinges 24 and configured to be rotatable about the y-axis (the additional plates provide movable mass elements and each of the elements is rotatable about its own axis perpendicular to the x-axis). All the elements may initially be fabricated as planar, within the xy-plane, as shown in FIG. 15B. The tilting of these auxiliary elements (proof mass elements) 20 results in variations of the mass distribution with respect to the rotation axis x and thus in variation of the moment of inertia of the structure 10 with respect to this axis. As indicated above, by tilting the auxiliary elements 20 at the frequency being twice the resonance frequency of the frame 30, it is possible to excite parametrically the vibrations of the frame 30 about the x-axis.

To this end, the present invention provides rotation sensor (angular rate sensor) system based on vibratory structures configured to enable time-dependent inertial properties. It should be noted that implementation of unidirectional, non-vibratory, motion in microstructures is typically very difficult. This is due to low reliability of micro elements performing relative motion accompanied by contact, friction, wear and stiction. As a result, the operational principles of conventional commercially available micromachined angular rate sensors are based on the coupling between two vibratory modes arising due to Coriolis force. The angular rate sensor system of the present invention is thus based on a fully compliant structure incorporating a proof mass assembly suspended using elastic flexures/connectors (e.g. spring-like connectors) configured to have non-zero average angular momentum of the proof mass assembly. Such angular rate sensor system therefore may operate in a similar manner to spinning disk gyros while enabling operational modes associated with vibratory gyro systems. Thus, according to the above described analytical and numerical results, the angular rate sensor system of the present invention is capable of provide various schemes of operation.

As indicated above when the rocking frame is mounted on a rotatable gimbal the system typically have three main moving elements, i.e. the angular rotation of the frame, the shift of the proof mass elements and the tilting of the frame on the gimbal. While the rotation of the frame and shift of the proof mass elements are typically forced during operation defining a drive mode of the system, the tilting of the gimbal is a result of variation in angular rate or orientation of platform to which the system might be attached, i.e. define the sense mode of the system. To this end, the system of the present invention may be configured to enable several actuation modes differing between them by the actual drive mode of the system. Some operational scenarios provide a pseudo spinning disc mode which is based on a drive mode configured such that the rocking motion of the frame and the shift of the proof mass elements are forced with equal frequencies thus generating nonzero angular momentum on average. The gimbal will rotate around a certain tilt angle corresponding to the external angular orientation of the system.

Other operational schemes are close to the known vibratory gyros while providing various advantages due to the novel structure of the system. The shift of the proof mass elements may be forced with equal frequency as the rocking motion of the frame, but with a certain phase shift between the two motions. The phase shift between the mass movement and the rocking motion varies the moment of inertia and a certain frequency, typically chosen to be as close as possible to the resonance frequency of the sense mode. This scheme provides coupling (Coriolis coupling) between the drive mode, being the variation (modulation) of moment of inertia, to the sense mode (tilting rotation of the gimbal) due to external rotations. Alternatively or additionally, the shift of the proof mass elements may actuate the rocking motion of the frame. When the proof mass elements are forced to shift at a frequency being twice the natural frequency of the rocking frame, the rocking motion of the frame will be actuated due to internal mode coupling. In this scheme the rocking motion of the frame may be coupled to the tilting of the gimbal due to external rotation.

It should be noted that different operational schemes are typically different by the stiffness of the connectors giving rise to variations of natural frequencies of different modes (rotation, rocking, shift of the mass etc.). It should also be noted that in order to provide efficient operation, the drive mode frequency is typically chosen to be as close as possible and preferably equal, to the resonance frequency of the forced mode (which may be the periodic displacement of the proof mass assembly and/or rotation of the rocking frame). Additionally, when operated in schemes providing Coriolis coupling between the drive mode and the sense mode, the system of the present invention may utilize the movable proof mass elements to enable fine tuning of the resonance frequencies of different modes and thus enhance the coupling.

According to some operational schemes the system provides a pseudo spinning disc sensor system. According to this scheme the rocking frame is excited by a forcing torque (e.g. electric, magnetic field or any other force) at a certain frequency to thereby rotate about a predetermined axis. The moment of inertia is determined by the configuration of the proof mass assembly which is perturbed at a constant amplitude and phase and at the frequency equal to the drive mode resonant frequency. Presence of the Coriolis coupling results in a force tilting the rocking frame due to external angular rate (to be measured) such that the when mounted on a gimbal, the tilting angle of the frame has a non-zero averaged steady component. The tilt angle of the frame can thus be measured to extract the external angular rate. Since the rocking frequency and frequency of the frame tilt are decoupled and that the measured value is the average tilt angle, the high frequency components of the frame tilt in response to external angular rate can be averaged out. This fact enables the system to operate in air since high quality factors, commonly required for the resonant operation of the sense mode, are not necessary in the case of the static operation. The force rebalance algorithm can be implemented for accurate measurements of the gimbal tilting angle while the high frequency components of the tilt angle may be controlled by applying a certain torque on the frame, or by controlling the amplitude or duty cycle (phase) of the moment of inertia modulation of the proof mass assembly. Additionally, the system can be used as a stabilized platform or North finding device (gyro compass) similarly to the conventional spinning disk structures.

According to some other operational schemes the moment of inertia of the proof mass is perturbed at the same frequency as the rocking motion of the frame, but the amplitude or phase of the proof mass elements movement are modulated. The modulation frequency is de-tuned from the rocking motion frequency and is matched with the natural frequency of the sense mode resulting in its resonant excitation. This operational scheme thus provides a vibratory angular rate sensor, in which the sense mode is coupled to variation of the moment of inertia and the actual drive mode, which is the rocking of the frame, is decoupled from the sense mode providing elimination of at least significant reducing of the static coupling between the modes.

According to a third group of operational scheme the system of the present invention may operate in a parametric resonance mode. The capability to dynamically vary the moment of inertia of the proof mass assembly allows efficient parametric excitation of the rocking motion of the frame. In this case the moment of inertia of the proof mass assembly is configured to vary at a frequency close to twice that of the natural frequency of the frame rotation (associated with stiffness of the connectors holding the frame) in the region of parametric resonance. The rotation/rocking motion of the frame is thus parametrically excited through the mass coefficient. In this scenario, the frequency of the sense mode should be close to the frequency of the drive mode. However, the advantage of this approach is that the bandwidth of the parametric resonance is wider than that of a regular linear resonance, which allows to use less strict requirements to the frequency matching between the drive and sense modes. The parametric excitation by means of time-varying inertia can be efficiently used, not only in angular rate sensors, but also in various micro actuators.

Moreover, the system of the present invention, providing a controllable moment of inertia may also be used also in large deflection micro actuators. One of the possible implementations is described with reference back to FIG. 10. The internal frame performs in-plane tilting motion about the Z-axis with angular velocity $\dot{\psi}$. The external frame, attached to a platform/substrate by elastic springs and can perform a tilting motion about Z-axis. The natural frequency of the external frame is configured to be much lower than the frequency of the rotating internal frame. During the tilting motion of the internal frame, the proof mass assembly is configured to displace the mass elements along a radial direction in such a way that the averaged angular momentum of the tilting frame is not-zero. The momentum is thus transferred to the external frame and this momentum transfer results in rotation of the external frame. As described above, since the frequency of the external frame is configured to be relatively low, the high frequency events of momentum transfer results in a quasi-static deflection of the external frame. Small amplitude high-frequency vibrations are superimposed on the static deflection. The static angle can be controlled by changing the amplitude or/and frequency of the internal frame as well as by the changing the duty cycle of the change in the moment of inertia. Moreover, the direction of static angle can be changed by changing the pattern of the mass motion during the cycle of vibration. For example, if during the half period corresponding to the counterclockwise rotation of the internal frame the mass is switched to its outer (larger distance from the Z-axis) position and to its inner (smaller radius) position during the second half period, the averaged angular momentum is counterclockwise and the rotation of the external frame is counterclockwise as well. In contrast, if the mass switching is shifted in such a way that it is in an outer position during the clockwise rotation of the internal, the external frame will rotate to the clockwise direction.

To this end, the structure of the present invention may be associated with a control unit configured to enable operation of the structure according to any one of the above operational modes. The control unit is configured to maintain and/or vary the drive mode including forced vibrations/rotation of the rocking frame, the proof mass assembly and a phase difference between these forced vibrations/rotations. In typical micro sensor system the vibration/rotation associated with the drive mode of the system is induced by a set of electrodes creating electric field configured to attract or repel the corresponding element (proof mass elements or rocking frame) and/or varying stiffness of elastic connectors of the structure. In such configurations of the system the control unit is configured to provide varying electric current to the corresponding electrodes while maintaining appropriate frequency to each of the drive mode forced motions and an appropriate phase difference between them.

According to some embodiments of the present invention, the angular rate sensor system may be fabricated from silicon on insulator wafer (SOI) using deep reactive ion etching (DRIE). An example of such fabrication process is shown in FIGS. 16A-16E. After cleaning of a wafer (FIG. 16A), a photo-resist (PR) is spun onto the front surface of the wafer, to thereby provide a pattern defining the structure of the device (FIG. 16B). The photo-resist is then soft baked on a hot plate to protect the substrate below. The lithography step (FIG. 16C) consists of a UV exposure of the front side of the mask, development of the PR and a hard bake. Next, deep reactive ion etching (DRIE) is performed on the device layer. The internal SOI (BOX) layer in this step is used as an etch stop layer (FIG. 16D). The exposed silicon-dioxide of the BOX layer is then removed by reactive ion etching (RIE) (FIG. 16E). This stage is followed by the removal of the PR using acetone, cleaning in IPA and drying. The wafer is then cleaved into individual dies and each die is wet released. The internal SOI layer is removed from under parts of the structure 4 defining the movable elements (connectors and mass elements) of the structure, while remains under the anchors 2. The release process starts by dipping each die into hydrofluoric (HF) acid followed by dipping into water and into IPA. Modification of the process is possible by adding a back side processing and a metallization stage. This modification may be used in order to provide a cavity under the device containing larger proof mass. In addition, openings in the handle prevent stiction between the device and the substrate.

Thus the present invention provides a novel technique for providing an angular rate sensor configured to perform vibratory rotation while being capable to vary it moment of inertia to thereby enable average non-zero angular momentum. The system is capable of providing various operational modes including pseudo spinning disc gyro, parametric actuation, vibratory gyro with sensing mode excited by inter modulation and consequently with low mechanical coupling, while providing the ability of fine tuning natural rotation thus simplifying manufacturing procedures. Those skilled in the art will readily appreciate that various modifications and changes can be applied to the embodiments of the invention as hereinbefore described without departing from its scope defined in and by the appended claims.

The invention claimed is:

1. A rotation sensor system comprising a rotating frame configured to be mounted on a gimbal and configured to be driven in controlled rocking motion about a predetermined axis of said frame, and a proof mass assembly mounted on said rotating frame, said proof mass assembly comprising one or more proof mass elements each mounted to be driven into controlled movement with respect to said predetermined axis along a certain path, a distance of the proof mass elements from said axis corresponding to a direction of the rocking motion of said frame, thereby affecting a moment of inertia of said rotating frame.

2. The rotation sensor system of claim 1, wherein each of said one or more proof mass elements is elastically connected to said rotating frame.

3. The rotation sensor system of claim 2, comprising a springing assembly for providing said elastic connection of the one or more proof mass elements to the rotating frame.

4. The rotation sensor system of claim 1, comprising an electrode assembly controllably operable to create and maintain a predetermined electric field within a field region, said proof mass assembly being located in the field region, thereby providing said controllable movement of the one or more proof mass elements.

5. The rotation sensor system of claim 1, said proof mass assembly comprises two or more of said proof mass elements arranged in a symmetric fashion around said predetermined axis of rotation defined by said rotating frame.

6. The rotation sensor system of claim 5, wherein the proof mass elements are arranged in a circular array around said predetermined axis.

7. The rotation sensor system of claim 1, wherein the system is configured as a planar system extending within a plane intersecting with said predetermined axis.

8. The rotation sensor system of claim 1, wherein the system is configured as a planar system extending within a plane parallel to said predetermined axis.

9. The rotation sensor system of claim 1, wherein said rotating frame carries a light deflection assembly, different angular position of the frame during the rocking motion thereof corresponding to a different deflection direction of light incident on said deflection assembly.

10. The rotation sensor system of claim 1, wherein said system is configured such that frequency of rotation of said rotating frame and frequency of movement of said proof mass assembly correspond to thereby provide the system with non zero angular momentum.

11. The rotation sensor system of claim 1, comprising an electrode arrangement providing an electric field configured to vary stiffness of connectors connecting said one or more proof mass elements to said rotating frame.

12. The rotation sensor system of claim 1, comprising a control unit configured and operable to provide drive force to thereby force at least one of said one or more proof mass elements of the proof mass assembly and rotation of said rotating frame with a predetermined frequency.

13. The rotation sensor system of claim 12, wherein said control unit is configured and operable to force movement of said one or more proof mass elements at a frequency being equal to twice a rotation frequency of said rotating frame, thereby actuating rotation of said rocking frame.

14. The rotation sensor system of claim 12, wherein said control unit is configured and operable to control a relative phase between rotation of said rotating frame and movement of said one or more proof mass elements.

15. The rotation sensor system of claim 14, wherein said control unit is configured to force rotation of said rotating frame and movement of said one or more proof mass elements with a predetermined frequency and phase to thereby provide the system of a certain non zero angular momentum.

16. The rotation sensor system of claim 14, wherein said control unit operates to control said relative phase to thereby vary moment of inertia of said rotating frame at a frequency corresponding to a natural frequency of a gimbal holding said rotating frame, thereby enabling coupling of said variation of the moment of inertia with tilting of said gimbal in accordance with external angular rotation.

17. The rotation sensor system of claim 14, wherein said control unit operates to control said relative phase to vary moment of inertia of said rotating frame to thereby enable tuning of rotation frequency of said frame.

18. The rotation sensor system of claim 1, wherein said system is configured as a micro rotation sensor system.

* * * * *